(12) United States Patent
Kobayashi et al.

(10) Patent No.: US 11,329,214 B2
(45) Date of Patent: May 10, 2022

(54) PIEZOELECTRIC ACTUATOR, PIEZOELECTRIC DRIVE DEVICE, ROBOT, ELECTRONIC COMPONENT TRANSPORT APPARATUS, AND PRINTER

(71) Applicant: Seiko Epson Corporation, Tokyo (JP)

(72) Inventors: Tomokazu Kobayashi, Shiojiri (JP); Mitsumi Kishida, Shiojiri (JP); Akio Konishi, Matsumoto (JP)

(73) Assignee: Seiko Epson Corporation

( * ) Notice: Subject to any disclaimer, the term of this patent is extended or adjusted under 35 U.S.C. 154(b) by 885 days.

(21) Appl. No.: 16/143,555

(22) Filed: Sep. 27, 2018

(65) Prior Publication Data

US 2019/0103550 A1 Apr. 4, 2019

(30) Foreign Application Priority Data

Sep. 29, 2017 (JP) ............................. JP2017-190191

(51) Int. Cl.
*H01L 41/318* (2013.01)
*H01L 41/047* (2006.01)
(Continued)

(52) U.S. Cl.
CPC .............. *H01L 41/318* (2013.01); *B25J 9/12* (2013.01); *B25J 15/08* (2013.01); *B41J 2/14233* (2013.01); *B41J 2/14274* (2013.01); *H01L 41/0477* (2013.01); *H01L 41/0815* (2013.01); *H01L 41/0973* (2013.01); *H01L 41/1876* (2013.01);
(Continued)

(58) Field of Classification Search
CPC ...... H01L 41/29; H01L 41/318; H01L 41/319; H01L 41/0477; H01L 41/0815; H01L 41/0906; H01L 41/0973; H01L 41/1876; B25J 9/12; B25J 15/08; B41J 2/14233; B41J 2/14274; B41J 2002/14258;
(Continued)

(56) References Cited

U.S. PATENT DOCUMENTS

| | | | |
|---|---|---|---|
| 8,366,248 B2 * | 2/2013 | Shimada | B41J 2/14201 347/72 |
| 2005/0127780 A1 * | 6/2005 | Ifuku | B41J 2/1646 310/311 |

(Continued)

FOREIGN PATENT DOCUMENTS

JP 3903474 B2 4/2007

*Primary Examiner* — Shawki S Ismail
*Assistant Examiner* — Monica Mata
(74) *Attorney, Agent, or Firm* — Harness, Dickey & Pierce, P.L.C.

(57) ABSTRACT

A piezoelectric actuator includes a vibration portion, a support portion that is integrally configured with the vibration portion and supports the vibration portion, and a piezoelectric element that is disposed on the vibration portion. The piezoelectric element includes a piezoelectric film including columnar crystal grains extending in a thickness direction. When a thickness of the piezoelectric film is referred to as T [μm] and an average diameter of the crystal grains in the width direction is referred to as D [μm], T/D is within a range of 10 to 100. The thickness T of the piezoelectric film is larger than or equal to 2 μm. A standard deviation of diameters of the crystal grains in the width direction is less than or equal to 1.8 μm.

18 Claims, 16 Drawing Sheets

(51) Int. Cl.
*H01L 41/08* (2006.01)
*H01L 41/09* (2006.01)
*H01L 41/187* (2006.01)
*B41J 2/14* (2006.01)
*B25J 15/08* (2006.01)
*H02N 2/00* (2006.01)
*H02N 2/10* (2006.01)
*B25J 9/12* (2006.01)
*H01L 41/29* (2013.01)
*H01L 41/319* (2013.01)

(52) U.S. Cl.
CPC .............. *H01L 41/29* (2013.01); *H02N 2/004* (2013.01); *H02N 2/0055* (2013.01); *H02N 2/103* (2013.01); *B41J 2002/14258* (2013.01); *H01L 41/0906* (2013.01); *H01L 41/319* (2013.01); *H02N 2/003* (2013.01)

(58) Field of Classification Search
CPC ...... H02N 2/003; H02N 2/004; H02N 2/0055; H02N 2/103
See application file for complete search history.

(56) References Cited

U.S. PATENT DOCUMENTS

2016/0284968 A1* 9/2016 Miyazawa ............. B25J 9/0087
2017/0155037 A1* 6/2017 Kubota ............... H01L 41/0986

\* cited by examiner

PIEZOELECTRIC ACTUATOR, PIEZOELECTRIC DRIVE DEVICE, ROBOT, ELECTRONIC COMPONENT TRANSPORT APPARATUS, AND PRINTER

BACKGROUND

1. Technical Field

The present invention relates to a piezoelectric actuator, a piezoelectric drive device, a robot, an electronic component transport apparatus, and a printer.

2. Related Art

Generally, a piezoelectric element included in a piezoelectric actuator has a structure in which a piezoelectric body is interposed between two electrodes. A piezoelectric element including a piezoelectric body formed by using a sol-gel method is known as the piezoelectric element (refer to, for example, Japanese Patent No. 3903474).

For example, a piezoelectric thin film element according to Japanese Patent No. 3903474 is configured to include a silicon substrate, a silicon oxide film formed on the silicon substrate, a titanium oxide film formed on the silicon oxide film, a lower electrode formed on the titanium oxide film, a PZT film formed on the lower electrode, and an upper electrode formed on the PZT film. Here, the PZT film is configured by a polycrystalline body, and in the crystal body, a width of a crystal grain in a film thickness direction is longer than a width of the crystal grain in a diameter direction and a relationship between the width of the crystal grain in the film thickness direction and the width of the crystal grain in the diameter direction is configured to be within a range in which the width in the diameter direction/ the width in the film thickness direction=⅓ to 1/10.

Recently, in order to achieve high efficiency in high-speed driving of a piezoelectric element, it is necessary to reduce a capacitance of the piezoelectric element by increasing a thickness of the piezoelectric element and to prevent a large current from flowing. However, in the piezoelectric thin film element according to Japanese Patent No. 3903474, while a relationship between a width of a crystal grain in a diameter direction and a width in a film thickness direction is satisfied as described above, when the thickness increases, a crack occurs in the film, and thereby, a problem in which drive efficiency cannot be sufficiently increased is generated.

SUMMARY

An advantage of some aspects of the invention is to provide a piezoelectric actuator that can increase drive efficiency even if a thickness of a piezoelectric element is increased, and to provide a piezoelectric drive device, a robot, an electronic component transport apparatus, and a printer which include the piezoelectric actuator.

The invention can be implemented as the following application examples or forms.

A piezoelectric actuator according to an application example includes a vibration portion, a support portion that is integrally configured with the vibration portion and supports the vibration portion, and a piezoelectric element that is disposed on the vibration portion. The piezoelectric element includes a piezoelectric film including columnar crystal grains extending in a thickness direction. When a thickness of the piezoelectric film is referred to as T [μm] and an average diameter of the crystal grains in the width direction is referred to as D [μm], T/D is within a range of 10 to 100. The thickness T of the piezoelectric film is larger than or equal to 2 μm. A standard deviation of diameters of the crystal grains in a width direction is less than or equal to 1.8 μm.

According to the piezoelectric actuator, T/D which is a ratio between a thickness T of a piezoelectric film and an average diameter D of crystal grains in the width direction is in a range of 10 to 100. The thickness T of the piezoelectric film is larger than or equal to 2 μm, a standard deviation of the diameters of the crystal grains in the width direction is less than or equal to 1.8 μm, and hereby, drive efficiency of the piezoelectric actuator can be increased.

In the piezoelectric actuator according to the application example, it is preferable that the piezoelectric film is formed of a material having a perovskite type crystal structure and has a (100) orientation ratio larger than or equal to 90%.

With this configuration, it is possible to accurately increase drive efficiency of a piezoelectric actuator.

In the piezoelectric actuator according to the application example, it is preferable that a dielectric loss of the piezoelectric film is less than or equal to 2%.

With this configuration, it is possible to accurately increase drive efficiency of a piezoelectric actuator.

In the piezoelectric actuator according to the application example, it is preferable that the thickness T of the piezoelectric film is within a range of 2 μm to 10 μm.

With this configuration, a piezoelectric actuator with excellent drive efficiency can be manufactured with high productivity.

In the piezoelectric actuator according to the application example, it is preferable that the average diameter D of the crystal grains in the width direction is within a range of 0.1 μm to 1 μm.

With this configuration, it is possible to accurately increase drive efficiency of a piezoelectric actuator.

In the piezoelectric actuator according to the application example, it is preferable that the piezoelectric film includes a plurality of layers that are formed of piezoelectric materials, and the piezoelectric element includes an intermediate layer that is disposed between the piezoelectric films and is configured to include titanium.

With this configuration, it is possible to reduce diffusion of electrode components of an electrode of a piezoelectric element into a piezoelectric film as compared with a case where the piezoelectric film is merely divided into a plurality of layers, and moreover, it is possible to increase an orientation ratio of a piezoelectric material configuring the piezoelectric film.

In the piezoelectric actuator according to the application example, it is preferable that a thickness of the intermediate layer is within a range of 2 nm to 6 nm.

With this configuration, an intermediate layer suitably exerts both of a function of reducing diffusion of electrode components of an electrode of a piezoelectric element into a piezoelectric film and a function of increasing orientation ratio of a piezoelectric material configuring the piezoelectric film.

In the piezoelectric actuator according to the application example, it is preferable that the intermediate layer is disposed between the layers that are located closest to the vibration portion, among the plurality of layers.

With this configuration, it is possible for an intermediate layer to effectively reduce diffusion of electrode components of an electrode of a piezoelectric element into a piezoelectric film by reducing a thickness of a layer located closest to a vibration portion among a plurality of layers included in the piezoelectric film. In addition, a distance between the intermediate layer and the electrode can be defined simply and with a high accuracy, according to the thickness of the layer located closest to the vibration portion side. The thickness of the piezoelectric film can be easily increased by increasing the number of layers located on a side opposite to the vibration portion with respect to the intermediate layer among the plurality of layers included in the piezoelectric film.

In the piezoelectric actuator according to the application example, it is preferable that a thickness of the layer located closest to the vibrating portion, among the plurality of layers is within a range of 60 nm to 160 nm.

With this configuration, it is possible to effectively reduce diffusion of electrode components of an electrode of a piezoelectric element into a piezoelectric film.

A piezoelectric drive device according to an application example includes the piezoelectric actuator according to the application example, and a driven member that is driven by a driving force from the piezoelectric actuator.

According to the piezoelectric drive device, drive efficiency of the piezoelectric drive device can be increased by increasing drive efficiency of a piezoelectric actuator.

A robot according to an application example includes the piezoelectric actuator according to the application example.

According to the robot, characteristics of the robot can be increased by increasing drive efficiency of a piezoelectric actuator. In addition, the piezoelectric actuator can be miniaturized, and as a result, it is possible to increase a freedom degree in designing the robot.

An electronic component transport apparatus according to an application example includes the piezoelectric actuator according to the present application example.

According to the electronic component transport apparatus, characteristics of the electronic component transport apparatus can be increased by increasing drive efficiency of a piezoelectric actuator. In addition, the piezoelectric actuator can be miniaturized. As a result, it is possible to increase a freedom degree in designing the electronic component transport apparatus.

A printer according to an application example includes the piezoelectric actuator according to the present application example.

According to the printer, characteristics of the printer can be increased by increasing drive efficiency of a piezoelectric actuator. In addition, the piezoelectric actuator can be miniaturized, and as a result, it is possible to increase a freedom degree in designing the printer.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a piezoelectric actuator, a piezoelectric drive device, a robot, an electronic component transport apparatus, and a printer according to the invention will be described in detail based on preferred embodiments illustrated in the accompanying drawings.

1. Piezoelectric Actuator

First, the embodiment of the piezoelectric actuator according to the invention will be described.

First Embodiment

Figure 1:
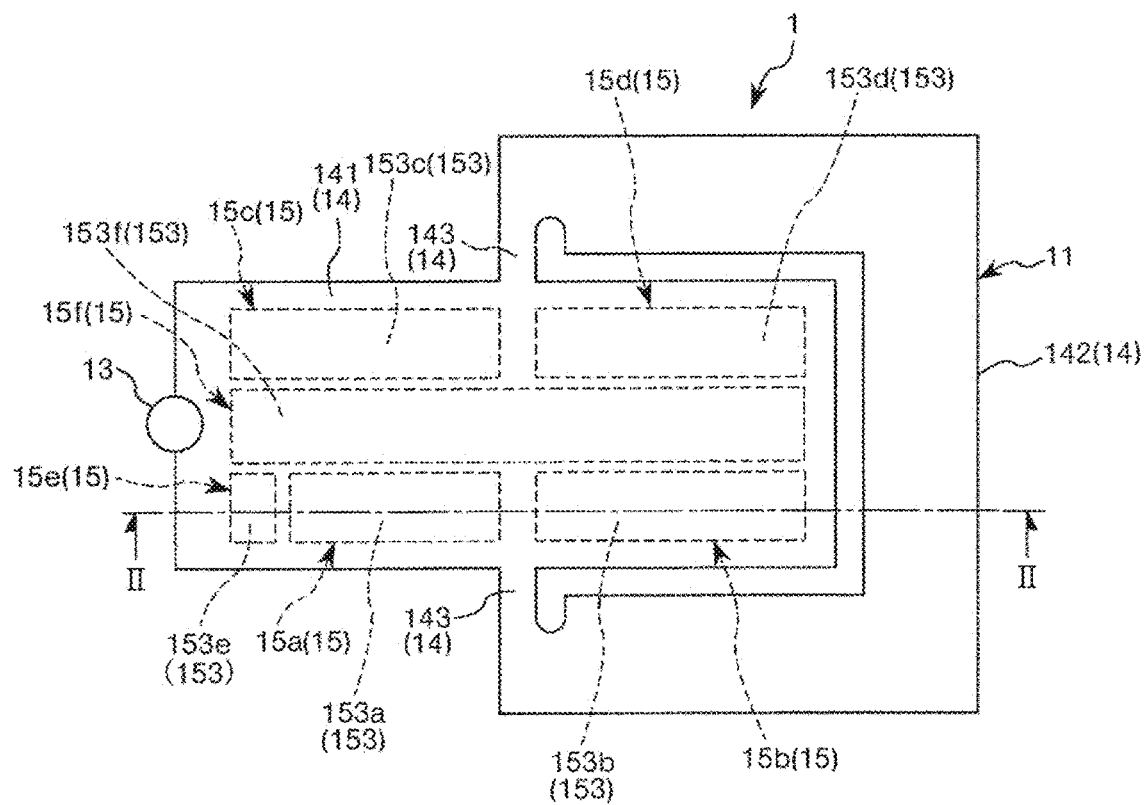
FIG. 1 is a plan view illustrating a piezoelectric actuator according to a first embodiment of the invention.
Figure 2:
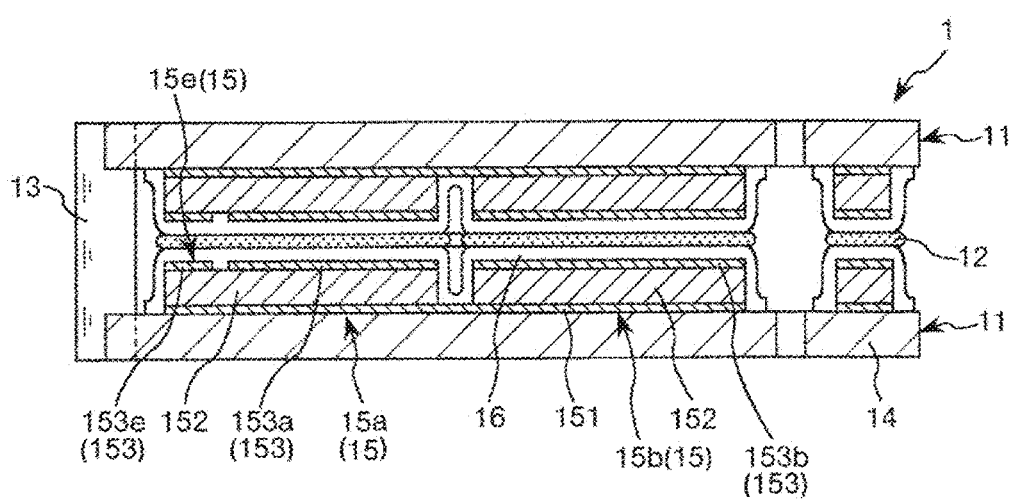
FIG. 2 is a sectional view taken along line II-II in FIG. 1.

FIG. 1 is a plan view illustrating the piezoelectric actuator according to a first embodiment of the invention. FIG. 2 is a sectional view taken along line II-II in FIG. 1. Hereinafter, for the sake of convenient description, an upper side in FIG. 2 is referred to as "upper" and a lower side in FIG. 2 is referred to as "lower".

As illustrated in FIG. 2, a piezoelectric actuator 1 illustrated in FIG. 1 includes two piezoelectric element units 11, an adhesive layer 12 bonding the two piezoelectric element units 11 to each other, and a projection member 13 bridging the two piezoelectric element units 11. Here, the two piezoelectric element units 11 are configured symmetrically (vertically symmetrical in FIG. 2) with respect to the adhesive layer 12, and have the same configuration as each other.

Each piezoelectric element unit 11 includes a substrate 14, a plurality of piezoelectric elements 15 provided on the substrate 14, and a protective layer 16 covering the plurality of piezoelectric elements 15.

As illustrated in FIG. 1, the substrate 14 includes a vibration portion 141, a support portion 142, and a pair of connection portions 143 connecting these portions. In the present embodiment, the vibration portion 141 has a rectangular shape in a plan view (hereinafter, also referred to simply as a "plan view") in a thickness direction of the substrate 14. In addition, the support portion 142 is separated from the vibration portion 141 along an outer periphery of a portion on one end side of the vibration portion 141 in a longitudinal direction in a plan view. In addition, the pair of connection portions 143 are disposed on both sides of the vibration portion 141 in the width direction (direction orthogonal to the longitudinal direction). The pair of connection portions 143 connect a central portion of the vibration portion 141 in the longitudinal direction to the support portion 142. The shapes, an arrangement, and the like of the vibration portion 141, the support portion 142, and the pair of connection portions 143 are not limited to those described above as long as a desirable change or vibration of the vibration portion 141 can be made. For example, the support portion 142 may be separated for each connection portion 143. In addition, the number, shapes, arrangement, and the like of the connection portions 143 are also random.

The substrate 14 is, for example, a silicon substrate. Although not illustrated, an insulating layer is provided on a surface of the substrate 14 on the piezoelectric element 15 side. Although not limited in particular, for example, in a case where the substrate 14 is a silicon substrate, this insulating layer is a thermal oxide film (silicon dioxide film) having a thickness of approximately 1 μm formed by thermally oxidizing a surface of the silicon substrate. In addition, another insulating layer, for example, a $ZrO_2$ film may be provided on the thermal oxide film. The $ZrO_2$ film can be formed by performing heat treatment of a Zr film formed by using a sputtering method or a vacuum evaporation method in an oxygen atmosphere.

A plurality of piezoelectric elements 15 are arranged on the vibration portion 141 of the substrate 14. In the present embodiment, the plurality of piezoelectric elements 15 are configured with five piezoelectric elements for drive 15a, 15b, 15c, 15d, and 15f and one piezoelectric element for detection 15e.

The piezoelectric element 15f is disposed on the vibration portion 141 in the longitudinal direction at the central portion of the vibration portion 141 in the width direction. The piezoelectric elements 15a and 15b are disposed on one side of the vibration portion 141 in the width direction and piezoelectric elements 15c and 15d are disposed on the other side, with respect to the piezoelectric element 15f. The piezoelectric elements 15a, 15b, 15c, and 15d are arranged to correspond to four regions divided in the longitudinal direction and the width direction of the vibration portion 141. In addition, the piezoelectric element 15e is disposed on a side opposite to the piezoelectric element 15b with respect to the piezoelectric element 15a, on one side of the vibration portion 141 in the width direction. The piezoelectric element 15e is not limited to the illustrated disposition and may be omitted.

Each of the piezoelectric elements 15a, 15b, 15c, 15d, 15e, and 15f arranged as described above has a first electrode 151 provided on the substrate 14, a piezoelectric film 152 provided on the first electrode 151, and a second electrode 153 provided on the piezoelectric film 152. Here, the first electrode 151 and the second electrode 153 are provided so as to interpose the piezoelectric film 152 therebetween in the thickness direction thereof. In addition, the piezoelectric film 152 is configured to expand and contract in the longitudinal direction of the vibration portion 141 by applying an electric field in a thickness direction thereof. Layer structures of the respective piezoelectric elements 15 (15a, 15b, 15c, 15d, 15e, and 15f) will be described in detail below.

The first electrode 151 is a common electrode commonly provided for the piezoelectric elements 15a, 15b, 15c, 15d, 15e, and 15f. Meanwhile, the second electrode 153 is a separate electrode that is separately provided for each of the piezoelectric elements 15a, 15b, 15c, 15d, 15e, and 15f. In the present embodiment, the piezoelectric film 152 is provided separately for each of the piezoelectric elements 15a, 15b, 15c, 15d, and 15f, but is provided in common to the piezoelectric elements 15a and 15e. The piezoelectric film 152 may be separately provided for each of the piezoelectric elements 15a and 15e or may be integrally provided with the piezoelectric elements 15a, 15b, 15c, 15d, 15e, and 15f.

Here, the plurality of second electrodes 153 are configured with a second electrode 153a provided corresponding to the piezoelectric element 15a, a second electrode 153b provided corresponding to the piezoelectric element 15b, a second electrode 153c provided corresponding to the piezoelectric element 15c, a second electrode 153d provided corresponding to the piezoelectric element 15d, the second electrode 153e provided corresponding to the piezoelectric element 15e, and the piezoelectric element 153f provided corresponding to the second electrode 15f.

The second electrode 153a and the second electrode 153d are electrically connected to each other via a wire (not illustrated). Likewise, the second electrode 153b and the second electrode 153c are electrically connected to each other via a wire (not illustrated). In addition, an insulating film such as an $SiO_2$ film (not illustrated) is appropriately provided on the second electrode 153 or between the two wires, and the like. In addition, the first electrode 151 is grounded (connected to the ground potential) via a wire (not illustrated). In addition, the first electrodes 151, the second electrodes 153a or the second electrodes 153d, the second electrodes 153b or the second electrodes 153c, and the second electrodes 153f of the two piezoelectric element units 11 are electrically connected via wires (not illustrated), respectively.

With such wiring, the piezoelectric elements 15a and 15d of the two piezoelectric element units 11 included in the piezoelectric actuator 1 are electrically connected to each other in parallel. Likewise, the piezoelectric elements 15b and 15c of the two piezoelectric element units 11 included in the piezoelectric actuator 1 are electrically connected to each other in parallel. In addition, the piezoelectric elements 15f of the two piezoelectric element units 11 included in the piezoelectric actuator 1 are electrically connected to each other in parallel.

A protective layer 16 is provided on the plurality of piezoelectric elements 15a, 15b, 15c, 15d, and 15e having the above-described configuration so as to collectively cover the plurality of piezoelectric elements. For example, a silicone resin, an epoxy resin, a polyimide resin, or the like can be used as a configuration material of the protective layer 16. In addition, the protective layer 16 can be formed by using, for example, a spin coating method.

In addition, a stacking body configured with the first electrode 151, the piezoelectric film 152, the second electrode 153, and the protective layer 16 described above is also disposed on the support portion 142 of the substrate 14. Thereby, it is possible to stably bond the two piezoelectric element units 11 via the adhesive layer 12.

The protective layers 16 of the two piezoelectric element units 11 configured as described above are bonded to each other via the adhesive layer 12. For example, an epoxy resin or the like is used as the adhesive layer 12.

In addition, the projection member 13 is fixed to an end portion of the vibration portion 141 of the two piezoelectric element units 11 opposite to the support portions 142 by, for example, an adhesive. In the present embodiment, the projection member 13 has a cylindrical shape, and a part of a cylindrical surface thereof protrudes from the vibration portion 141. A material having an excellent abrasion resistance property is preferably used as a configuration material of the projection member 13, and, for example, ceramics or the like can be used therefor. The shape of the projection member 13 is not limited to a cylindrical shape as long as a driving force can be transferred to a driven portion.

In the piezoelectric actuator 1 configured as described above, the piezoelectric elements 15*a*, 15*b*, 15*c*, 15*d*, and 15*f* for drive expand and contract by an inverse piezoelectric effect such that the tip of the projection member 13 is elliptically moved. Thereby, the projection member 13 applies a unidirectional driving force to a driven member (not illustrated) to drive the driven member. At this time, vibration of the vibration portion 141 is a combined vibration of bending vibration (horizontal vibration) of an S shape (or an inverted S shape) according to expansion and contraction of the piezoelectric elements 15*a*, 15*b*, 15*c*, and 15*d* and a vertical vibration according to expansion and contraction of the piezoelectric element 15*f*. The piezoelectric element 15*e* for detection outputs a signal according to a drive state (vibration state) of the vibration portion 141 due to a piezoelectric effect in accordance with the vibration of the vibration portion 141.

Layer Structure of Piezoelectric Element

Hereinafter, a layer structure of the piezoelectric element 15 will be described in detail.

Figure 3:
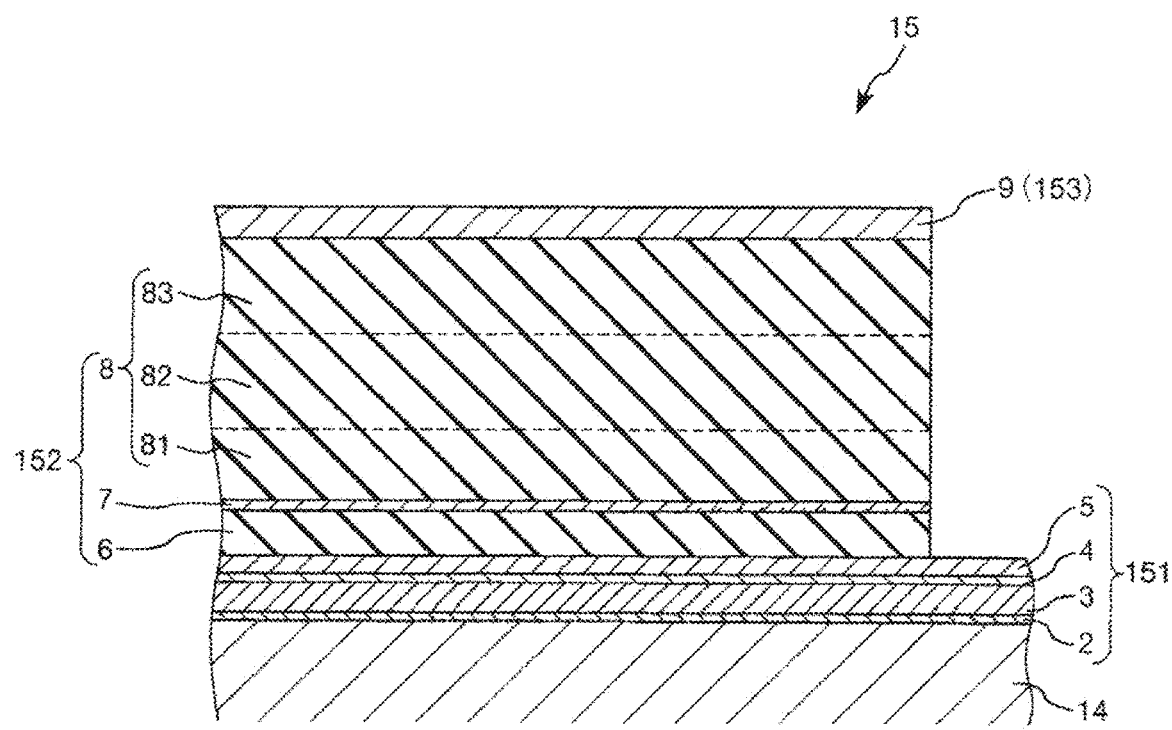
FIG. 3 is a partially enlarged sectional view of a piezoelectric element illustrated in FIG. 2.

FIG. 3 is a partially enlarged sectional view of the piezoelectric element illustrated in FIG. 2. Hereinafter, for the sake of convenient description, an upper side in FIG. 3 is referred to as "upper" and a lower side in FIG. 3 is referred to as "lower".

As illustrated in FIG. 3, the piezoelectric element 15 is configured by sequentially stacking a titanium layer 2, a platinum layer 3, an iridium layer 4, a titanium layer 5, a first piezoelectric layer 6, an intermediate layer 7, a second piezoelectric layer 8, and an iridium layer 9 on the substrate 14. Here, a staking body configured with the titanium layer 2, the platinum layer 3, the iridium layer 4, and the titanium layer 5 configures the first electrode 151 described above. In addition, a stacking body configured with the first piezoelectric layer 6, the intermediate layer 7, and the second piezoelectric layer 8 configures the piezoelectric film 152 described above. In addition, the iridium layer 9 configures the second electrode 153 described above.

That is, as described above, the piezoelectric element 15 includes the substrate 14, the first electrode 151 disposed on the substrate 14, the piezoelectric film 152 disposed on the first electrode 151, and the second electrode 153 disposed on the piezoelectric film 152. The first electrode 151 is configured by sequentially stacking the titanium layer 2, the platinum layer 3, the iridium layer 4, and the titanium layer 5 from the substrate 14 side. In addition, the piezoelectric film 152 is configured by sequentially stacking the first piezoelectric layer 6, the intermediate layer 7, and the second piezoelectric layer 8 from the first electrode 151 side to the second electrode 153 side. In addition, the second electrode 153 is configured with the iridium layer 9. Here, as will be described in detail below, the piezoelectric film 152 includes the first piezoelectric layer 6 and the second piezoelectric layer 8 (layers 81 to 83 to be described below) as "a plurality of layers" configured to include a piezoelectric material. "the plurality of layers" means an aggregate or a staking body of the plurality of layers.

Hereinafter, the respective layers configuring the piezoelectric element 15 will be sequentially described in detail.

First and Second Electrodes

As described above, the first electrode 151 is configured by sequentially stacking the titanium layer 2, the platinum layer 3, the iridium layer 4, and the titanium layer 5 from the substrate 14 side.

The titanium layer 2 is formed of titanium (Ti). The titanium layer 2 functions as an adhesion layer for improving adhesion of the first electrode 151 to the substrate 14. Here, a thickness of the titanium layer 2 is not limited in particular, but is larger than or equal to, for example, approximately 3 nm and is smaller than or equal to approximately 50 nm. Instead of the titanium layer 2, a chromium layer formed of chromium may be used as the adhesion layer.

The platinum layer 3 is formed of platinum (Pt), and the iridium layer 4 is formed of iridium (Ir). Both iridium and platinum are electrode materials excellent in conductivity and are chemically similar to each other. By providing the platinum layer 3 and the iridium layer 4 as described above, characteristics of the first electrode 151 can be made excellent as an electrode. Here, although a thickness of the platinum layer 3 is not limited in particular, the thickness is larger than or equal to, for example, approximately 50 nm and smaller than or equal to approximately 200 nm. In addition, although the thickness of the iridium layer 4 is not limited in particular, the thickness is larger than or equal to, for example, approximately 4 nm and smaller than or equal to approximately 20 nm.

Either the platinum layer 3 or the iridium layer 4 may be omitted, or a layer formed of iridium may be further provided on aside opposite to the iridium layer 4 with respect to the platinum layer 3. In addition, instead of the platinum layer 3 and the iridium layer 4, or in addition to the platinum layer 3 and the iridium layer 4, a layer formed of an electrode material other than iridium and platinum may be used. An example of the electrode material other than iridium and platinum includes a metallic material such as aluminum (Al), nickel (Ni), gold (Au), or copper (Cu), and one of the materials can be used alone or a combination of two or more of the materials.

The titanium layer 5 is formed of titanium (Ti). When forming the first piezoelectric layer 6, the titanium layer 5 has a function to control orientation of the first piezoelectric layer 6 by using island-like Ti as a crystal nucleus, thereby, improving crystallinity (orientation property) of the first piezoelectric layer 6. Here, a thickness of the titanium layer 5 is not limited in particular but is, larger than or equal to, for example, approximately 3 nm and smaller than or equal to approximately 20 nm.

Meanwhile, as described above, the second electrode 153 is configured with the iridium layer 9. The iridium layer 9 is formed of iridium (Ir). Here, a thickness of the iridium layer 9 is not limited in particular, but is larger than or equal to, for example, approximately 15 nm and smaller than or equal to approximately 70 nm. Instead of the iridium layer 9 or in addition to the iridium layer 9, a layer formed of platinum may be used for the second electrode 153. In addition, a layer formed of an electrode material other than iridium and platinum may be used as the second electrode 153.

Piezoelectric Layer

As described above, the piezoelectric film 152 is interposed between the first electrode 151 and the second electrode 153 described above. The piezoelectric film 152 is configured by sequentially stacking the first piezoelectric layer 6, the intermediate layer 7, and the second piezoelectric layer 8 from the first electrode 151 side to the second electrode 153 side.

First and Second Piezoelectric Layers

The first and second piezoelectric layers 6 and 8 are obtained by separately forming the piezoelectric film 152 into film formations and heat treatment a plurality of times. As such, by separately forming the piezoelectric film 152 for a plurality of film formation and heat treatment, it is possible to reduce diffusion of electrode components of the first electrode 151 into the piezoelectric film 152. In the present embodiment, the second piezoelectric layer 8 is configured by stacking the three layers 81, 82, and 83. Thereby, a thickness of the second piezoelectric layer 8 is easily increased. In addition, it is effective in reducing diffusion of the electrode component of the first electrode 151 into the piezoelectric film 152. The number of layers configuring the second piezoelectric layer 8 is not limited to the drawings, and may be two, or four or more. In addition, the first piezoelectric layer 6 may also be configured by a plurality of layers.

Each of the first and second piezoelectric layers 6 and 8 is formed of a piezoelectric ceramic material having a perovskite type crystal structure represented by a general composition formula $ABO_3$. Specifically, for example, lead titanate ($PbTiO_3$), lead zirconate titanate ($Pb(Zr,Ti)O_3$), lead zirconate ($PbZrO_3$), lead lanthanum titanate (($Pb$, $La$), $TiO_3$), lead zirconate titanate lanthanum (($Pb,La)(Zr,Ti)O_3$), lead zirconium niobate titanate ($Pb(Zr,Ti,Nb)O_3$), lead zirconium magnesium niobate titanate ($Pb(Zr,Ti)(Mg,Nb)O_3$), and the like may be used as configuration materials of the first and second piezoelectric layers 6 and 8. Particularly, it is preferable that the piezoelectric material configuring the first and second piezoelectric layers 6 and 8 is lead zirconate titanate (PZT).

Here, a total thickness of the first piezoelectric layer 6 and the second piezoelectric layer 8 is larger than or equal to 2 μm, and preferably, is within a range of 2 μm to 10 μm. Thereby, the piezoelectric element 15 having a large thickness can be obtained. A thickness of the intermediate layer 7, which will be described below, is much smaller than the thickness of the first piezoelectric layer 6 or the second piezoelectric layer 8, and thereby, approximately, a thickness T of the entire piezoelectric film 152 can be regarded as the total thickness of the first piezoelectric layer 6 and the second piezoelectric layer 8.

The thickness of the first piezoelectric layer 6 is smaller than the thickness of the second piezoelectric layer 8, and more preferably, is within a range of 0.01 to 0.7 times the thickness of the second piezoelectric layer 8. Thereby, it is possible to effectively reduce diffusion of the electrode component of the first electrode 151 into the piezoelectric film 152 and to increase the thickness of the piezoelectric element 15.

It is preferable that a thickness of a layer located closest to the first electrode 151 side (that is, the vibration portion 141 side) among a plurality of layers included in the piezoelectric film 152, that is, a specific thickness of the first piezoelectric layer 6 is within a range of 60 nm to 160 nm and is more preferable to be within a range of 80 nm to 130 nm. Thereby, it is possible to effectively reduce the diffusion of the electrode component of the first electrode 151 into the piezoelectric film 152. In contrast to this, if the thickness is too thin, when the piezoelectric film 152 is thickened, the electrode component from the first electrode 151 is hardly confined into the first piezoelectric layer 6 and the electrode component reaches the second piezoelectric layer 8, and thereby, a range in which the electrode component of the first electrode 151 diffuses into the piezoelectric film 152 tends to expand. Meanwhile, even if the thickness is too thin, the range in which the electrode component of the first electrode 151 diffuses into the piezoelectric film 152 tends to expand.

In addition, as described above, when the first piezoelectric layer 6 is formed, the piezoelectric material of the first piezoelectric layer 6 can be grown in the thickness direction with an island-shaped Ti of the titanium layer 5 as a crystal nucleus. In addition, according to this, the piezoelectric material of the second piezoelectric layer 8 can also be grown in the thickness direction. Accordingly, the piezoelectric film 152 includes columnar crystal grains extending in the thickness direction (see FIGS. 18 and 19). Thereby, crystallinity of the piezoelectric film 152 can be enhanced. Particularly, since Ti forms columnar crystal grains extending in the crystal orientation (100) direction, piezoelectric characteristics of the piezoelectric film 152 can be enhanced.

Since drive efficiency of the piezoelectric element 15 is increased by the thickness of the piezoelectric film 152 described above, a diameter of a crystal grain in a width direction of the crystal grains included in the piezoelectric film 152 satisfies a predetermined condition. Specifically, when a thickness of the piezoelectric film 152 is referred to as T [μm] and an average diameter of the crystal grains in the width direction (direction orthogonal to the thickness direction of the piezoelectric film 152) which are included in the piezoelectric film 152 is referred to as D [μm], T/D is within a range of 10 to 100, and preferably, within a range of 13 to 67, and more preferably, within a range of 20 to 35. In addition, a standard deviation (degree of variation of the diameters of the crystal grains) of the diameters of the crystal grains in the width direction of the crystal grains included in the piezoelectric film 152 is less than or equal to 1.8 μm, and preferably, less than or equal to 1 μm, and more preferably, less than or equal to 0.5 μm. The crystal grains included in the piezoelectric film 152 are formed over substantially the entire region of the piezoelectric film 152 in the thickness direction (see FIG. 18), and the thickness T of the piezoelectric film 152 is approximately equal to a length of the crystal grain in the thickness direction of the piezoelectric film 152. In addition, measurement of the average diameter D (average diameter of the crystal grains) is performed based on JIS G 0551 "Microscope Test Method for Steel-Crystal Grain Size".

Intermediate Layer

The intermediate layer 7 is interposed between the first piezoelectric layer 6 and the second piezoelectric layer 8 described above. The intermediate layer 7 is configured to include titanium (Ti). As described above, the intermediate layer 7 has a function of dividing the piezoelectric film 152 into two layers of the first piezoelectric layer 6 and the second piezoelectric layer 8 and also reducing diffusion of the electrode component of the first electrode 151 into the piezoelectric film 152, and more specifically, a function (function as a "diffusion preventing layer") of preventing the electrode component of the first electrode 151 from moving from the first piezoelectric layer 6 to the second piezoelectric layer 8.

As such, the piezoelectric film 152 has a plurality of layers configured by a piezoelectric material, and the piezoelectric element 15 has the intermediate layer 7 that is disposed between the layers of the piezoelectric film 152 and is formed of titanium. Thereby, it is possible to reduce diffusion of the electrode component of the first electrode 151 of the piezoelectric element 15 into the piezoelectric film 152 as compared with a case where the piezoelectric film 152 is simply divided into a plurality of layers, and moreover, it is possible to increase a desirable orientation ratio of the piezoelectric material configuring the piezoelectric film 152.

Here, the intermediate layer 7 is disposed between layers located closest to the first electrode 151 side (vibration portion 141 side) among the layers included in the first piezoelectric layer 6 and the second piezoelectric layer (layers 81 to 83) which are the "plurality of layers" configuring the piezoelectric film 152, that is, disposed between the first piezoelectric layer 6 and the second piezoelectric layer 8. Thereby, a thickness of the layer (the first piezoelectric layer 6) located closest to the first electrode 151 side among the plurality of layers included in the piezoelectric film 152 is reduced, and it is possible for the intermediate layer 7 to effectively reduce diffusion of the electrode component of the first electrode 151 into the piezoelectric film 152. In addition, it is possible to define simply and with high accuracy a distance between the intermediate layer 7 and the first electrode 151, according to the thickness of the layer (first piezoelectric layer 6) closest to the first electrode 151 side. Accordingly, there is an advantage that desirable characteristics of the piezoelectric element 15 are easily obtained. In addition, by increasing the number of layers (layers 81 to 83) located on the second electrode 153 side with respect to the intermediate layer 7 among the plurality of layers included in the piezoelectric film 152, the thickness of the piezoelectric film 152 can be easily increased.

In addition, it is preferable that the thickness of the intermediate layer 7 is within a range of 2 to 6 nm, and more preferably, within a range of 3 to 5 nm. Thereby, the above-described function of the intermediate layer 7, that is, the function (If it is too thick, a voltage drop may occur due to insertion of a low dielectric constant layer) of reducing the diffusion of the electrode component of the first electrode 151 into the piezoelectric film 152 can be suitably exhibited. In contrast to this, there is a tendency that if the thickness is too thin, an action as a crystal nucleus tends to decrease. Meanwhile, there is a tendency that, if the thickness is too thick, the first piezoelectric layer 6 and the second piezoelectric layer 8 are completely divided by the intermediate layer 7 being used as a boundary, and crystals become discontinuous or an interlayer delamination occurs between the first piezoelectric layer 6 and the second piezoelectric layer 8.

Method of Manufacturing Piezoelectric Actuator

Hereinafter, a method of manufacturing the piezoelectric actuator 1 will be briefly described.

Figure 4:
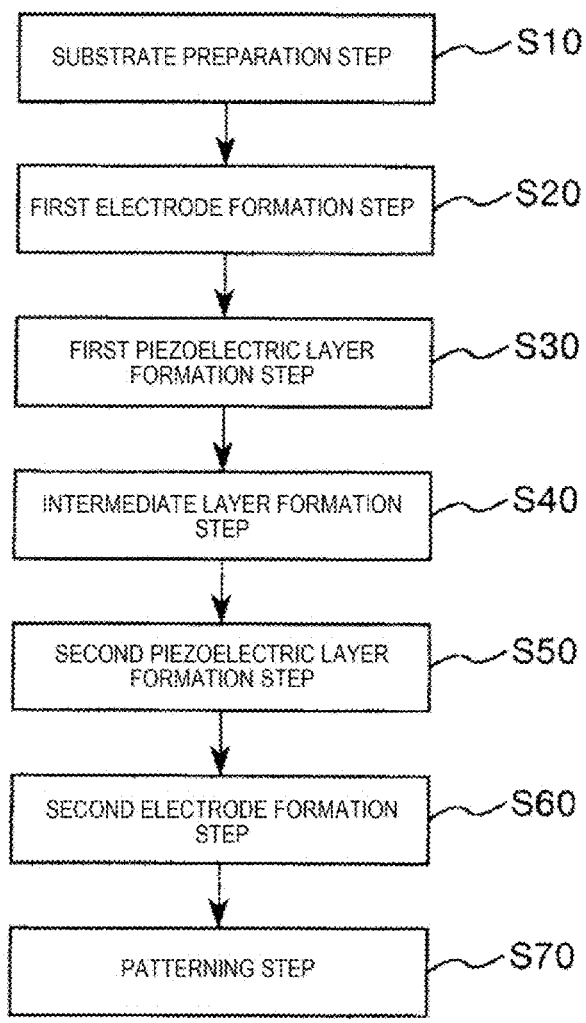
FIG. 4 is a flowchart illustrating a method of manufacturing the piezoelectric element having a layer structure illustrated in FIG. 3.

FIG. 4 is a flowchart illustrating a method of manufacturing the piezoelectric element having the layer structure illustrated in FIG. 3.

As illustrated in FIG. 4, a method of manufacturing the piezoelectric actuator 1 includes 1: substrate preparation step S10, 2: first electrode formation step S20, 3: first piezoelectric layer formation step S30, 4: an intermediate layer formation step S40, 5: a second piezoelectric layer formation step S50, 6: a second electrode formation step S60, and 7: a patterning step S70. Hereinafter, each step will be described briefly and sequentially.

1: Substrate Preparation Step S10

Figure 5:
FIG. 5 is a view illustrating a substrate preparation step illustrated in FIG. 4.

FIG. 5 is a view illustrating a substrate preparation step illustrated in FIG. 4.

First, as illustrated in FIG. 5, the substrate 14 is prepared. The substrate 14 is, for example, a silicon substrate, and is obtained by forming a silicon oxide film on one surface of the silicon substrate using thermal oxidation. A $ZrO_2$ film may be formed on the silicon oxide film by using a sputtering method or a vacuum evaporation method.

2: First Electrode Formation Step S20

Figure 6:
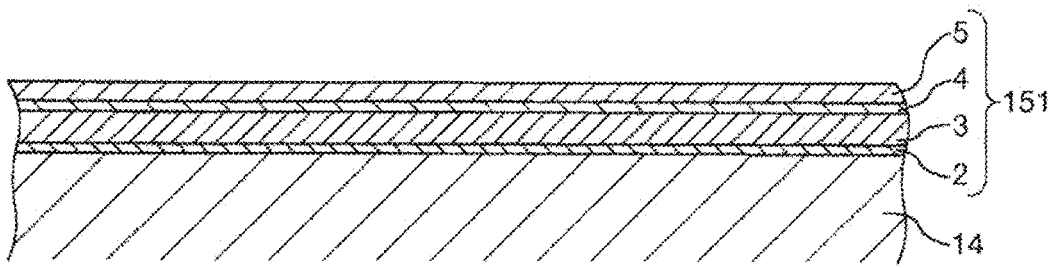
FIG. 6 is a view illustrating a first electrode formation step illustrated in FIG. 4.

FIG. 6 is a view illustrating the first electrode formation step illustrated in FIG. 4.

Next, as illustrated in FIG. 6, a titanium layer 2, a platinum layer 3, an iridium layer 4, and a titanium layer 5 are sequentially formed on one surface of the substrate 14 to form the first electrode 151. Here, each of the titanium layer 2, the platinum layer 3, the iridium layer 4, and the titanium layer 5 is formed by, for example, the sputtering method or the like.

3: First Piezoelectric Layer Formation Step S30

Figure 7:
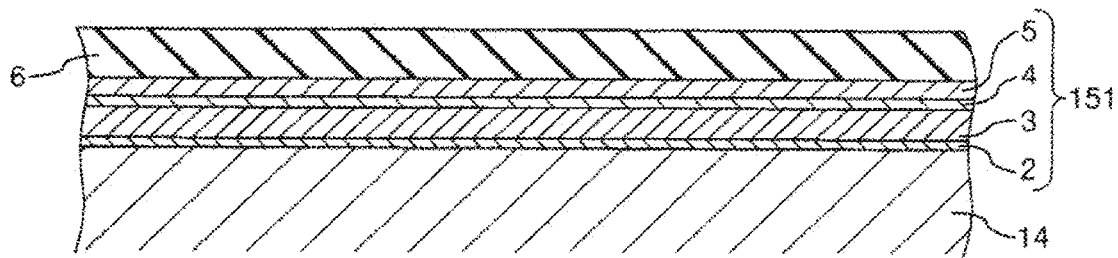
FIG. 7 is a view illustrating a first piezoelectric layer formation step illustrated in FIG. 4.

FIG. 7 is a view illustrating the first piezoelectric layer formation step illustrated in FIG. 4.

Next, as illustrated in FIG. 7, the first piezoelectric layer 6 is formed on the first electrode 151. Here, formation of the first piezoelectric layer 6 is performed by forming a precursor layer of a piezoelectric body using a sol-gel method and baking and crystallizing the precursor layer. The formation of the precursor layer may be repeated and then a plurality of precursor layers may be baked collectively.

4: Intermediate Layer Formation Step S40

Figure 8:
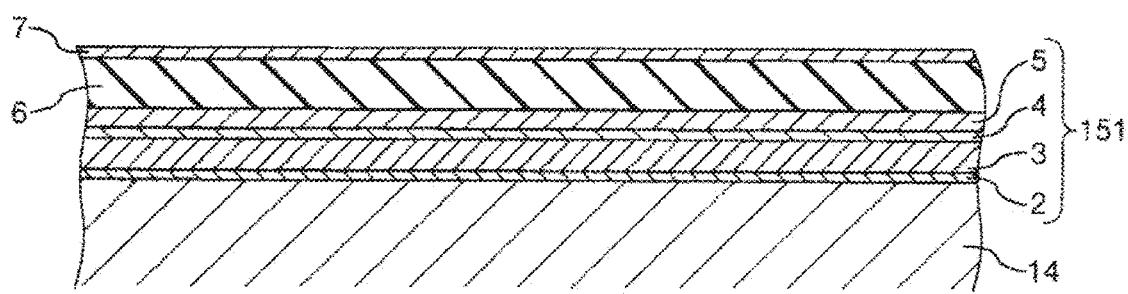
FIG. 8 is a view illustrating an intermediate layer formation step illustrated in FIG. 4.

FIG. 8 is a view illustrating the intermediate layer formation step illustrated in FIG. 4.

Next, as illustrated in FIG. 8, the intermediate layer 7 is formed on the first piezoelectric layer 6. Here, the intermediate layer 7 may be formed by using, for example, a sputtering method or the like.

5: Second Piezoelectric Layer Formation Step S50

Figure 9:
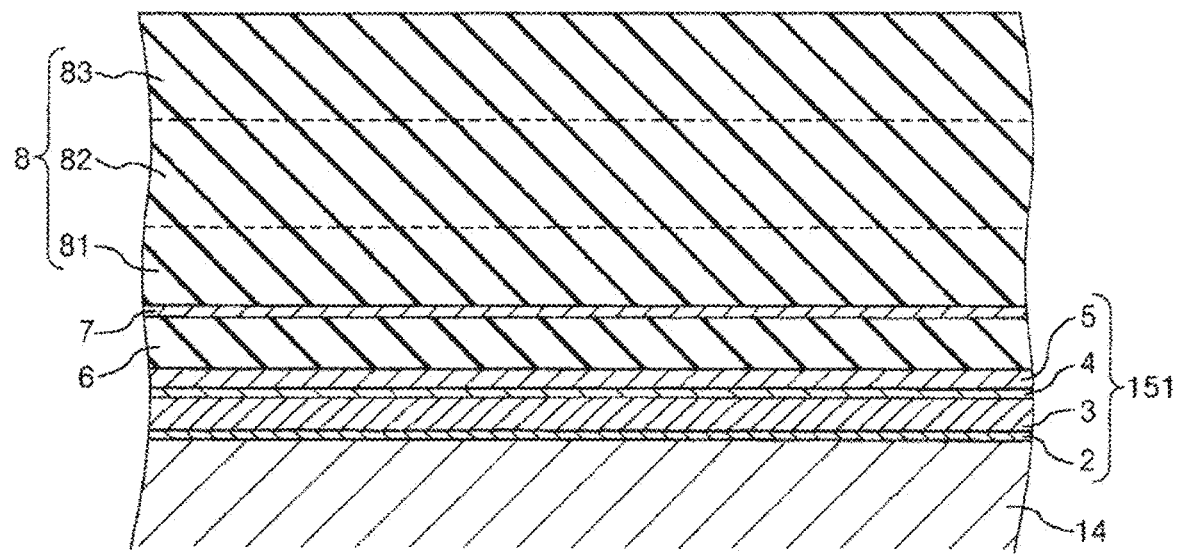
FIG. 9 is a view illustrating a second piezoelectric layer formation step illustrated in FIG. 4.

FIG. 9 is a view illustrating the second piezoelectric layer formation step illustrated in FIG. 4.

Next, as illustrated in FIG. 9, the second piezoelectric layer 8 is formed on the intermediate layer 7. Here, formation of the second piezoelectric layer 8 is the same as formation of the first piezoelectric layer 6, and is performed by, for example, forming a precursor layer of a piezoelectric body using a sol-gel method and baking and crystallizing the precursor layer, but in the present step, the second piezoelectric layer 8 having a desirable thickness is formed by repeating the formation and baking of the precursor layer a plurality of times. That is, in order to form each of the layers 81 to 83, the precursor layer is formed and baked. Thereby, it is possible to form the second piezoelectric layer 8 with an excellent orientation property, compared to a case where the plurality of second piezoelectric layers 8 are formed by forming and baking the precursor layer once.

6: Second Electrode Formation Step S60

Figure 10:
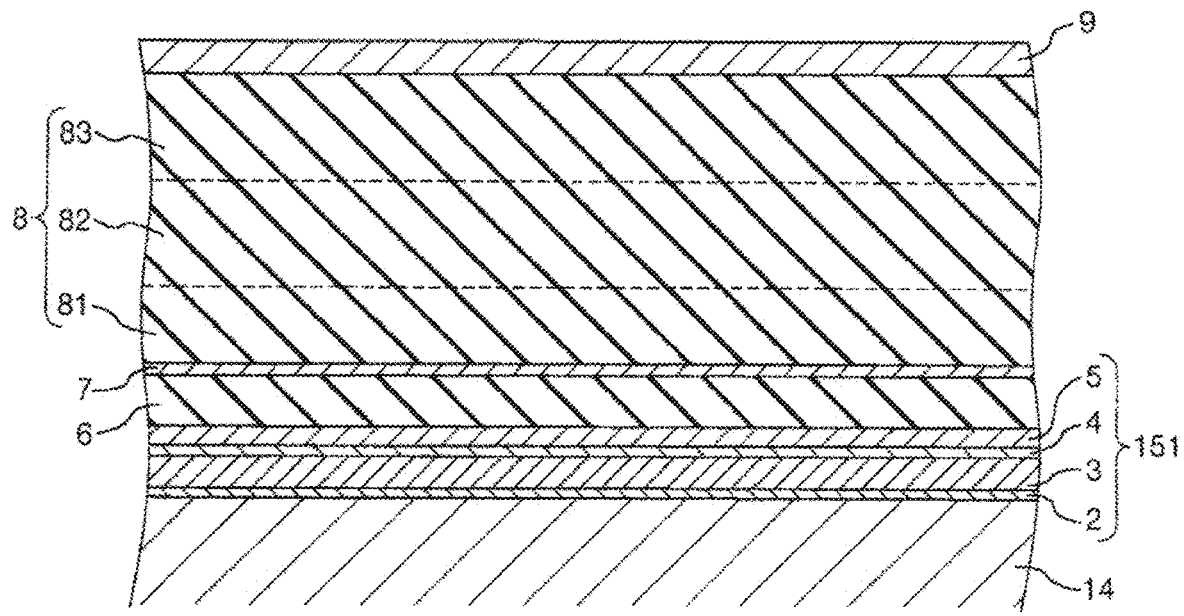
FIG. 10 is a view illustrating a second electrode formation step illustrated in FIG. 4.

FIG. 10 is a view illustrating the second electrode formation step illustrated in FIG. 4.

Next, as illustrated in FIG. 10, the iridium layer 9 is formed on the second piezoelectric layer 8. Here, the iridium layer 9 is formed by using, for example, a sputtering method or the like.

7: Patterning Step S70

Figure 11:
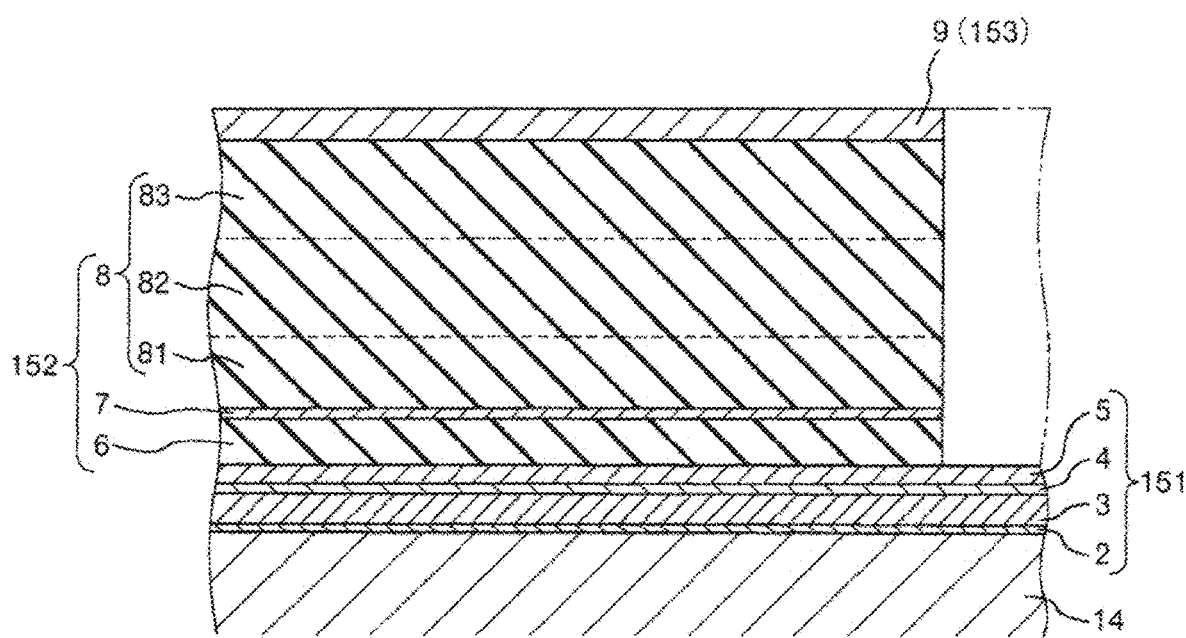
FIG. 11 is a view illustrating a patterning step illustrated in FIG. 4.

FIG. 11 is a view illustrating the patterning step illustrated in FIG. 4.

Finally, as illustrated in FIG. 11, by collectively patterning the first piezoelectric layer 6, the intermediate layer 7, the second piezoelectric layer 8, and the iridium layer 9, the piezoelectric film 152 and the second electrode 153 are formed. Here, the patterning is performed by forming a mask using, for example, a photoresist method and performing dry etching through the mask.

Thereby, the piezoelectric element 15 can be obtained.

As described above, the piezoelectric actuator 1 includes the vibration portion 141, the support portion 142 which is integrally formed with the vibration portion 141 via the connection portion 143 and supports the vibration portion 141, and the piezoelectric element 15 which is disposed on the vibration portion 141. The piezoelectric element 15 includes the piezoelectric film 152 including columnar crystal grains extending in the thickness direction. Particularly, when a thickness of the piezoelectric film 152 is referred to as T [μm] and an average diameter of the crystal grains in the width direction which are included in the piezoelectric film 152 is referred to as D [μm], T/D is within a range of 10 to 100. In addition, the thickness T of the piezoelectric film 152 is larger than or equal to 2 μm. Furthermore, a standard deviation of the diameters of the crystal grains in the width direction which are included in the piezoelectric film 152 is less than or equal to 1.8 μm.

According to the piezoelectric actuator 1, drive efficiency of the piezoelectric actuator 1 can be increased by the fact that T/D which is a ratio between the thickness T of the piezoelectric film 152 and the average diameter D of the crystal grains in the width direction is within a range of 10 to 100, the thickness T of the piezoelectric film 152 is larger than or equal to 2 μm, and the standard deviation of the diameters of the crystal grain in the width direction is less than or equal to 1.8 μm.

Here, the piezoelectric film 152 is formed of a material having a perovskite type crystal structure. It is preferable that the piezoelectric film 152 has a (100) orientation ratio which is larger than or equal to 90%. Thereby, it is possible to accurately increase drive efficiency of the piezoelectric actuator 1.

In addition, it is preferable that a dielectric loss of the piezoelectric film 152 is less than or equal to 2%. Thereby, it is possible to efficiently increase the drive efficiency of the piezoelectric actuator 1.

Furthermore, it is preferable that the thickness T of the piezoelectric film 152 is within a range of 2 μm to 10 μm, and more preferably, within a range of 3 μm to 10 μm, and still more preferably, within a range of 5 μm to 10 μm. Thereby, it is possible to manufacture with high productivity the piezoelectric actuator 1 having excellent drive efficiency.

It is preferable that the average diameter D of the crystal grains in the width direction which are included in the piezoelectric film 152 is within a range of 0.1 μm to 1 μm, and more preferably, within a range of 0.1 μm to 0.5 μm, and still more preferably, within a range of 0.1 μm to 0.3 μm. Thereby, it is possible to accurately increase drive efficiency of the piezoelectric actuator 1.

2. Piezoelectric Drive Device

Next, an embodiment of a piezoelectric drive device according to the invention will be described.

Figure 12:
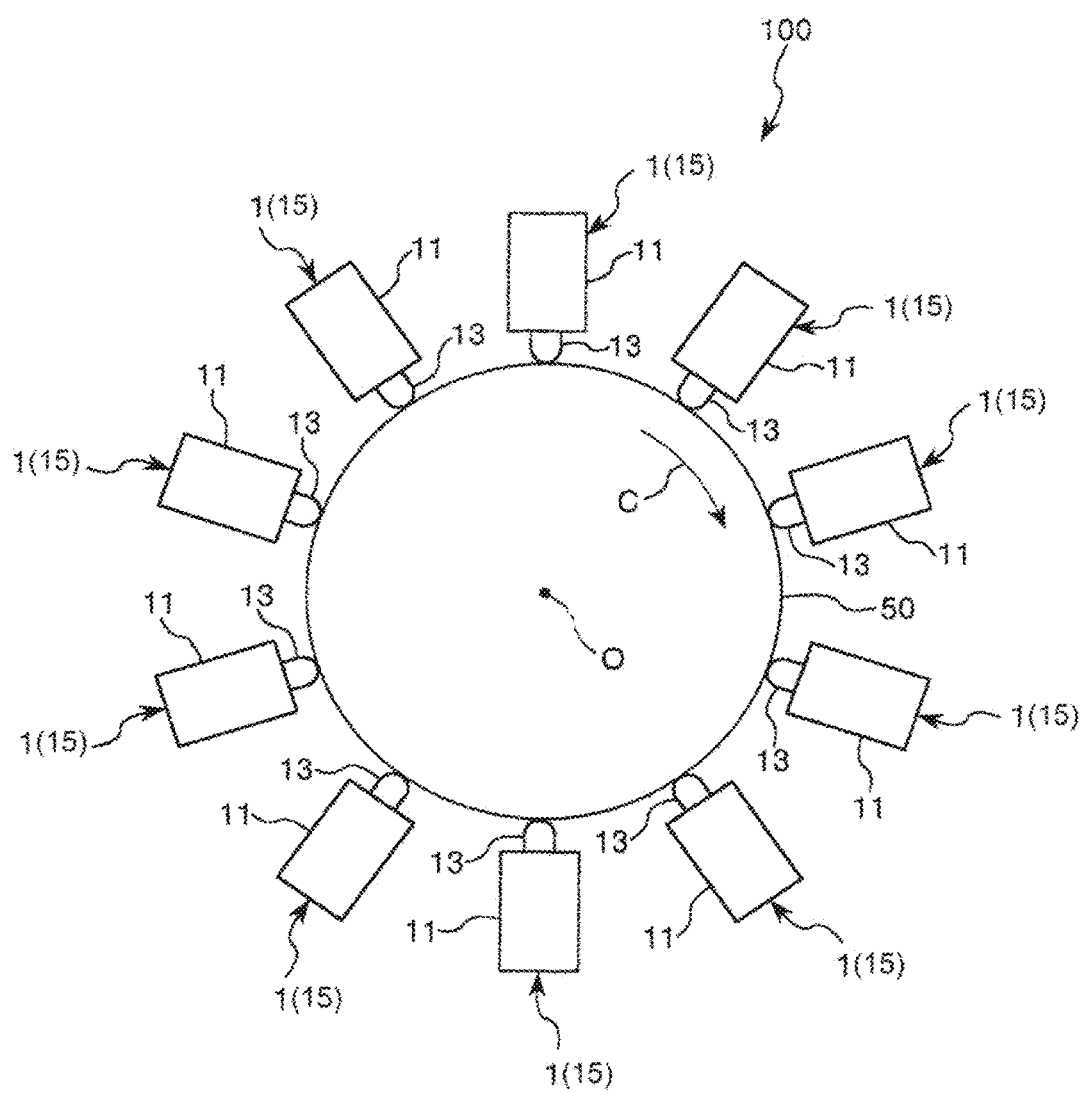
FIG. 12 is a schematic view illustrating an embodiment of a piezoelectric drive device according to the invention.

FIG. 12 is a schematic view illustrating the embodiment of the piezoelectric drive device according to the invention.

A piezoelectric drive device 100 illustrated in FIG. 12 is a piezoelectric motor. The piezoelectric drive device 100 includes a rotor 50 which is a driven member rotatable around a rotation axis O, and a plurality of the piezoelectric actuators 1 arranged side by side along an outer peripheral surface of the rotor 50.

The piezoelectric drive device 100 drives (vibrates) each of the plurality of piezoelectric actuators 1, thereby, rotating the rotor 50 around the rotation axis O in a direction indicated by an arrow C in FIG. 12.

The piezoelectric drive device 100 described above includes the piezoelectric actuator 1, and the rotor 50 which is a driven member that is driven by a driving force from the piezoelectric actuator 1. According to the piezoelectric drive device 100, drive efficiency of the piezoelectric actuator 1 is increased, and thereby, it is possible to increase drive efficiency of the piezoelectric drive device 100.

3. Robot

Figure 13:
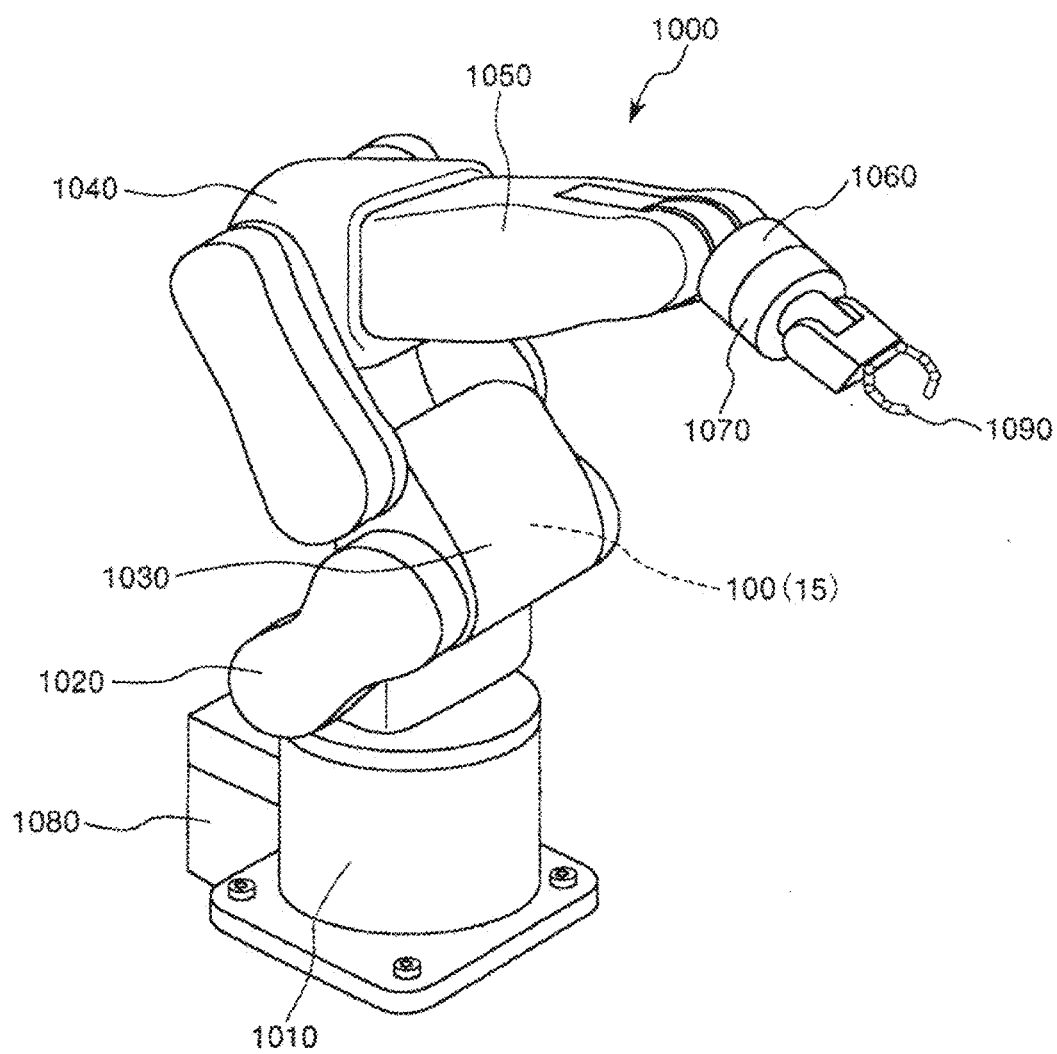
FIG. 13 is a perspective view illustrating an embodiment of a robot according to the invention.

FIG. 13 is a perspective view illustrating an embodiment of the robot according to the invention.

The robot 1000 illustrated in FIG. 13 can perform work such as material feeding, material removing, transport, and assembly of a precision apparatus and components (object) configuring the precision apparatus. As illustrated in FIG. 13, the robot 1000 is a six-axis robot, and includes a base 1010 fixed to a floor or a ceiling, an arm 1020 rotatably connected to the base 1010, an arm 1030 rotatably connected to the arm 1020, an arm 1040 rotatably connected to the arm 1030, an arm 1050 rotatably connected to the arm 1040, an arm 1060 rotatably connected to the arm 1050, an arm 1070 rotatably connected to the arm 1060, and a control unit 1080 that controls drive of the arms 1020, 1030, 1040, 1050, 1060, and 1070. In addition, a hand connection portion is provided on the arm 1070, and an end effector 1090 corresponding to the work to be performed by the robot 1000 is attached to the hand connection portion. In addition, the piezoelectric drive device 100 (piezoelectric actuator 1) is mounted on all or a part of each joint portion, and the respective arms 1020, 1030, 1040, 1050, 1060, and 1070 are rotated by drive of the piezoelectric drive device 100. The drive of each piezoelectric drive device 100 is controlled by the control unit 1080.

The robot 1000 described above includes the piezoelectric actuator 1. According to the robot 1000, drive efficiency of the piezoelectric actuator 1 is increased, and thereby, characteristics of the robot 1000 can be enhanced. In addition, a size of the piezoelectric actuator 1 can be reduced, and as a result, it is possible to increase a freedom degree in designing the robot 1000.

4. Electronic Component Transport Apparatus

Figure 14:
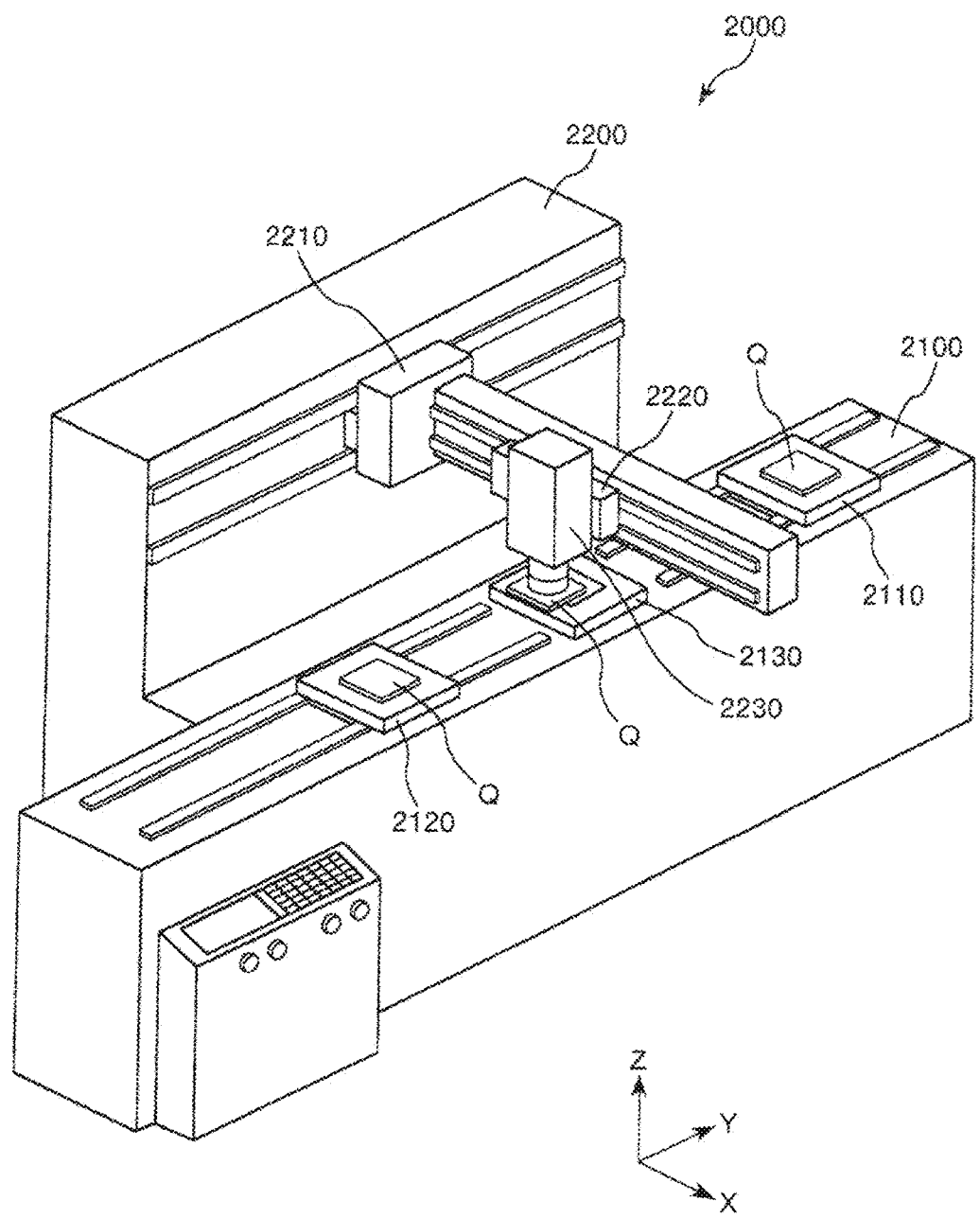
FIG. 14 is a perspective view illustrating an embodiment of an electronic component transport apparatus according to the invention.
Figure 15:
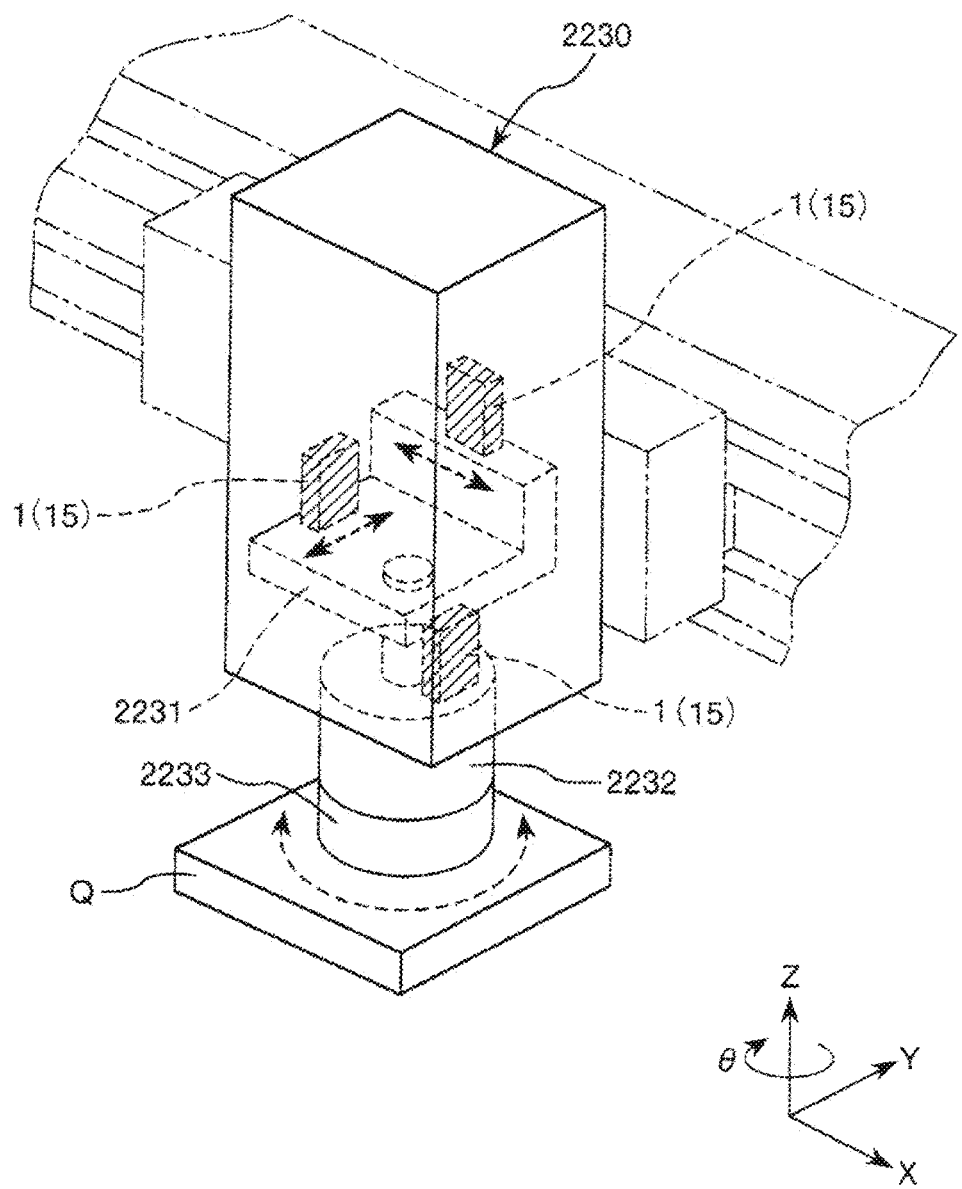
FIG. 15 is a perspective view of an electronic component holding portion included in the electronic component transport apparatus illustrated in FIG. 14.

FIG. 14 is a perspective view illustrating an embodiment of an electronic component transport apparatus according to the invention. FIG. 15 is a perspective view of an electronic component holding portion included in the electronic component transport apparatus illustrated in FIG. 14.

The electronic component transport apparatus 2000 illustrated in FIG. 14 is applied to an electronic component inspection device and includes a base 2100 and a support base 2200 disposed on a side of the base 2100. In addition, the base 2100 is provided with an upstream stage 2110 on which an electronic component Q to be inspected is placed and is transported in the Y-axis direction, a downstream stage 2120 on which the inspected electronic component Q is placed and is transported in the Y-axis direction, and an inspection table 2130 which is located between the upstream stage 2110 and the downstream stage 2120 and inspects electrical characteristics of the electronic component Q. For example, the electronic component Q includes a semiconductor, a semiconductor wafer, a display device such as a CLD or an OLED, a liquid crystal device, various sensors, an ink jet head, various MEMS devices, and the like.

In addition, a Y-stage 2210 that is movable in the Y-axis direction with respect to the support base 2200 is provided on the support base 2200, an X-stage 2220 that is movable in the X-axis direction with respect to the Y-stage 2210 is provided on the Y-stage 2210, and an electronic component holding portion 2230 that is movable in the Z-axis direction with respect to the X stage 2220 is provided on the X-stage 2220. In addition, as illustrated in FIG. 15, the electronic component holding portion 2230 includes a fine adjustment plate 2231 that is movable in the X-axis direction and the Y-axis direction, a rotation portion 2232 that is rotatable around the Z-axis with respect to the fine adjustment plate 2231, and a holding portion 2233 that is provided in the rotation portion 2232 and holds the electronic component Q. In addition, the piezoelectric actuator 1 that moves the fine adjustment plate 2231 in the X-axis direction, the piezoelectric actuator 1 that moves the fine adjustment plate 2231 in the Y-axis direction, and the piezoelectric actuator 1 that rotates the rotation portion 2232 around the Z-axis are embedded in the electronic component holding portion 2230.

The electronic component transport apparatus 2000 described above includes the piezoelectric actuator 1. According to the electronic component transport apparatus 2000, drive efficiency of the piezoelectric actuator 1 is increased, and thereby, characteristics of the electronic component transport apparatus 2000 can be enhanced. In addition, it is possible to miniaturize the piezoelectric actuator 1. As a result, it is possible to increase a freedom degree in designing the electronic component transport apparatus 2000.

5. Printer

Figure 16:
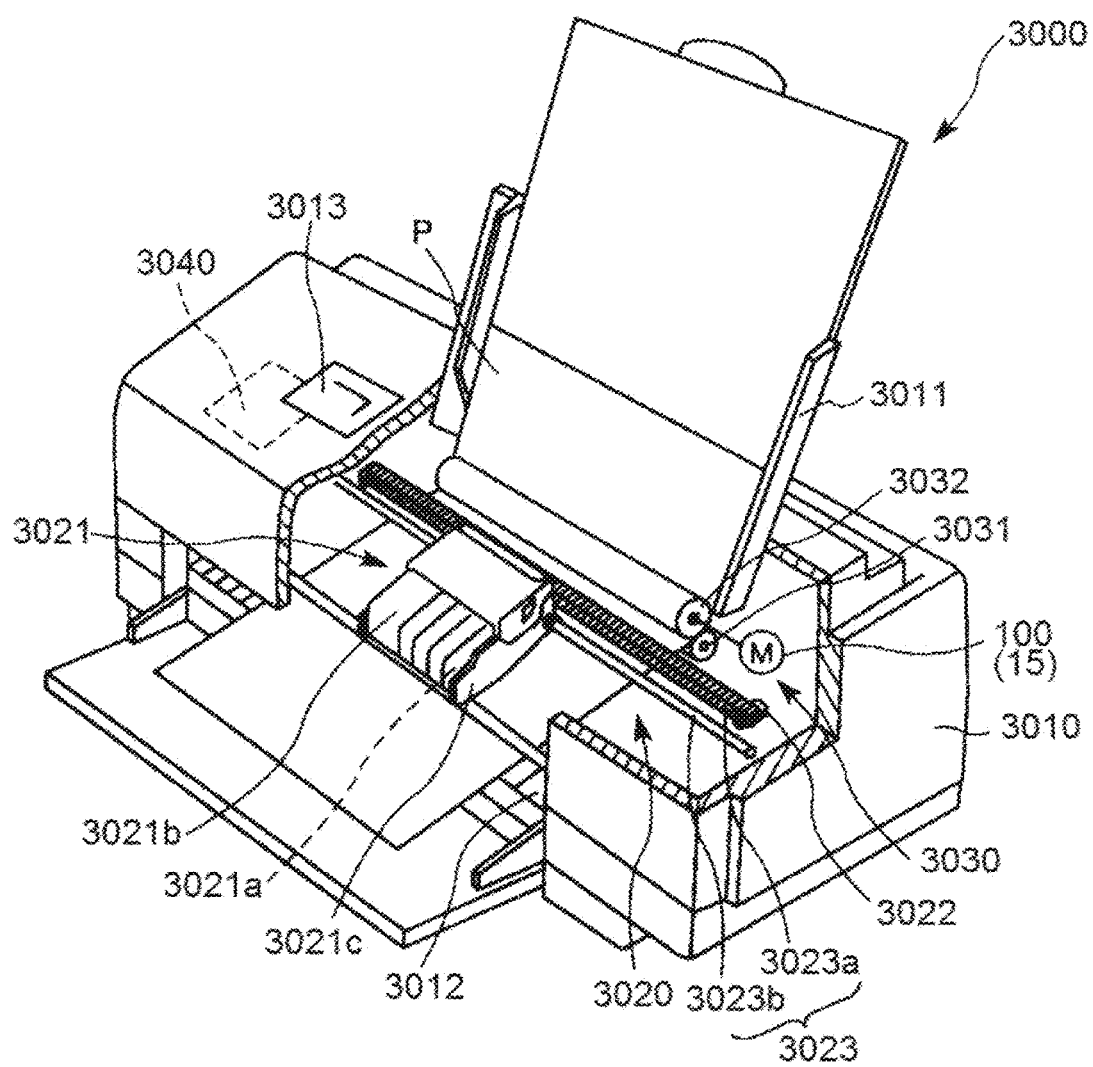
FIG. 16 is a view illustrating an embodiment of a printer according to the present invention.

FIG. 16 is a view illustrating an embodiment of a printer according to the invention.

The printer 3000 illustrated in FIG. 16 is an ink jet recording type printer. The printer 3000 includes an apparatus main body 3010, a print mechanism 3020, a paper feeding mechanism 3030, and a control unit 3040 provided in the apparatus main body 3010.

The apparatus main body 3010 is provided with a tray 3011 for placing record paper P, a paper discharge port 3012 for discharging the record paper P, and an operation panel 3013 such as a liquid crystal display.

The printing mechanism 3020 includes a head unit 3021, a carriage motor 3022, and a reciprocating mechanism 3023 for reciprocating the head unit 3021 by a driving force of the carriage motor 3022. In addition, the head unit 3021 includes a head 3021a which is an ink jet type recording head, an ink cartridge 3021b which supplies ink to the head 3021a, and a carriage 3021c on which the head 3021a and the ink cartridge 3021b are mounted. The reciprocating mechanism 3023 includes a carriage guide shaft 3023a that supports the carriage 3021c so as to be able to reciprocate, and a timing belt 3023b that moves the carriage 3021c on the carriage guide shaft 3023a by using the driving force of the carriage motor 3022.

The paper feeding mechanism 3030 includes a driven roller 3031 and a driving roller 3032 that are in pressure contact with each other, and the piezoelectric drive device 100 (piezoelectric actuator 1) which is a paper feeding motor that drives the driving roller 3032.

The control unit 3040 controls the print mechanism 3020, the paper feeding mechanism 3030, and the like based on print data input from a host computer such as a personal computer.

In the printer 3000, the paper feeding mechanism 3030 intermittently feeds the record paper P one by one to the vicinity of a lower portion of the head unit 3021. At this time, the head unit 3021 reciprocates in a direction substantially orthogonal to the feeding direction of the record paper P, and printing on the record paper P is performed.

The printer 3000 described above includes the piezoelectric actuator 1. According to the printer 3000, drive efficiency of the piezoelectric actuator 1 is increased, and thereby, characteristics of the printer 3000 can be enhanced. In addition, the piezoelectric actuator 1 can be miniaturized, and as a result, it is possible to increase a freedom degree in designing the printer 3000.

Although a piezoelectric actuator, a piezoelectric drive device, a robot, an electronic component transport apparatus, and a printer according to the invention are described based on the illustrated embodiments, the invention is not limited to this, and each configuration can be replaced with any configuration having the same function. In addition, any other configuration may be added to the invention. In addition, the respective embodiments may be appropriately combined with each other.

EXAMPLES

Next, specific examples according to the invention will be described.

1. Manufacture of Piezoelectric Actuator

Example 1

The piezoelectric actuator illustrated in FIGS. 1 and 2 are manufactured as follows.

First, a silicon substrate is prepared, and a silicon oxide film with a thickness of 1 μm is formed on one surface of the silicon substrate using thermal oxidation.

Next, a titanium layer with a thickness of 20 nm, a platinum layer with a thickness of 130 nm, an iridium layer with a thickness of 5 nm, and a titanium layer with a thickness of 4 nm are sequentially formed on a thermal oxide film of the silicon substrate by using a sputtering method, and a first electrode is formed.

Next, an upper portion of the first electrode is coated with a sol composition of PZT by using an ink jet method, a precursor layer of the PZT is formed by drying the composition, the precursor layer is baked at 740° C. by using rapid thermal anneal (RTA) to crystallize, and thereby, a first piezoelectric layer having a thickness of 110 nm is formed.

Next, titanium is deposited on the first piezoelectric layer by using a sputtering method to form an intermediate layer having a thickness of 4 nm.

Next, coating and drying of a sol composition portion and baking of the precursor layer which are the same as the formation of the first piezoelectric layer described above are alternately repeated on the intermediate layer, and thereby, a second piezoelectric layer having a thickness of 2 μm is formed.

Next, iridium is deposited on the second piezoelectric layer by using a sputtering method, and an iridium layer having a thickness of 50 nm which serves as a second electrode is formed.

Next, the first piezoelectric layer, the intermediate layer, the second piezoelectric layer, and the iridium layer are collectively patterned by dry etching, and thereby, a piezoelectric film and a second electrode are formed. Thereby, a stacking body is obtained in which the first electrode, the piezoelectric film, and the second electrode are sequentially stacked on the silicon substrate.

Finally, the silicon substrate of the stacking body is dry-etched to form the vibration portion, the support portion, and the connection portion. Thereby, two piezoelectric element units are obtained, and thereafter, the two piezoelectric element units are bonded to each other with an epoxy type adhesive, and a projection member (driven member) made of ceramics is bonded to the vibration portion of the stacking body by the epoxy type adhesive. Thereby, a piezoelectric actuator having the structure illustrated in FIGS. 1 and 2 is obtained.

Examples 2 and 3 and Comparative Example 1

The piezoelectric actuator is manufactured in the same manner as in Example 1 except that a thickness of the second piezoelectric layer is changed as illustrated in Table 1. Here, thickness of the second piezoelectric layer is adjusted by changing the number of repetitions of coating and drying of the sol composition portion and baking of the precursor layer.

TABLE 1

| | Piezoelectric film | | | | Evaluation | |
|---|---|---|---|---|---|---|
| | Average diameter of grains D [µm] | Standard deviation of diameters of crystal grains [µm] | Thickness T [µm] | T/D | Output ratio | Efficiency ratio |
| Example 1 | 0.15 | 0.2 | 2 | 13.3 | 1.3 | 1.4 |
| Example 2 | 0.15 | 0.2 | 3 | 20.0 | 2.4 | 2.8 |
| Example 3 | 0.15 | 0.2 | 5 | 33.3 | 2.8 | 3.5 |
| Comparative Example 1 | 0.15 | 0.2 | 1.3 | 8.7 | 1 | 1 |
| Comparative Example 2 | 0.3 | 1.5 | 3 | 10.0 | 1.3 | 0.9 |
| Comparative Example 3 | 0.3 | 1.5 | 1.3 | 4.3 | — | — |
| Comparative Example 4 | 0.3 | 1.5 | 5 | 16.7 | — | — |

Comparative Example 2

The piezoelectric actuator is manufactured in the same manner as in Example 2 described above except that a baking temperature of each precursor layer (except for a final layer) for forming each of the first piezoelectric layer and the second piezoelectric layer is set to 600° C., and baking of the final layer among a plurality of the precursor layers for forming the second piezoelectric layer is performed at 750° C. by using a furnace (furnace burning) method.

Comparative Examples 3 and 4

The piezoelectric actuator is manufactured in the same manner as in Comparative Example 2 except that the thickness of the second piezoelectric layer is changed as illustrated in Table 1. Here, the thickness of the second piezoelectric layer is adjusted by changing the number of repetitions of coating and drying of the sol composition portion and baking of the precursor layer.

2. Evaluation of Piezoelectric Actuator
Output Ratio and Efficiency Ratio

In Examples 1 to 3 and Comparative Examples 1 and 2, a rotatable rotor is rotated by the piezoelectric actuator, and an output and efficiency are measured. The output is calculated from a relational expression of (rotor torque)×(rotation speed of rotor)=output. The efficiency is calculated from a relational expression of (output power from the piezoelectric element)/(input power to the piezoelectric element). Results of the output ratio in which the output of Comparative Example 1 is set to 1 and the efficiency ratio in which the efficiency of Comparative Example 1 is set to 1 are illustrated in Table 1. In addition, Table 1 illustrates the ratio T/D between the thickness T of the piezoelectric film and the average diameter D of the crystal grains in the width direction, and the thickness T of the piezoelectric film.

As illustrated in Table 1, each of Examples 1 to 3 has excellent output ratio and efficiency ratio as compared with Comparative Example 1, and also has the output ratio and the efficiency ratio equal to or higher than those of Comparative Example 2.

(100) Orientation Ratio of Piezoelectric Film

Figure 17:
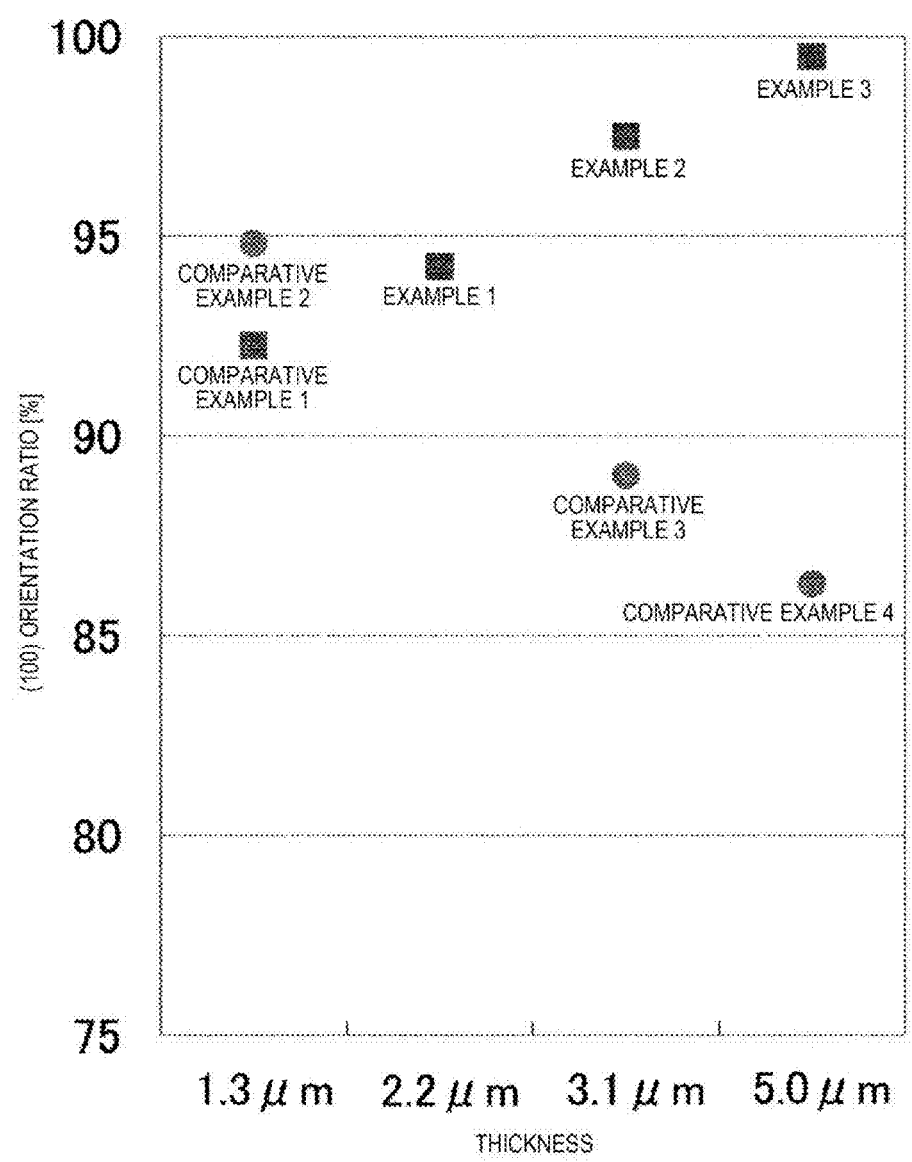
FIG. 17 is a graph illustrating a relationship between thicknesses of piezoelectric layers of piezoelectric elements and an orientation ratio according to Examples 1 to 3 and Comparative Examples 1 to 4.

FIG. 17 is a graph illustrating a relationship between the thicknesses of the piezoelectric layers of the piezoelectric elements and the orientation ratio according to Examples 1 to 3 and Comparative Examples 1 to 4.

Figure 18:
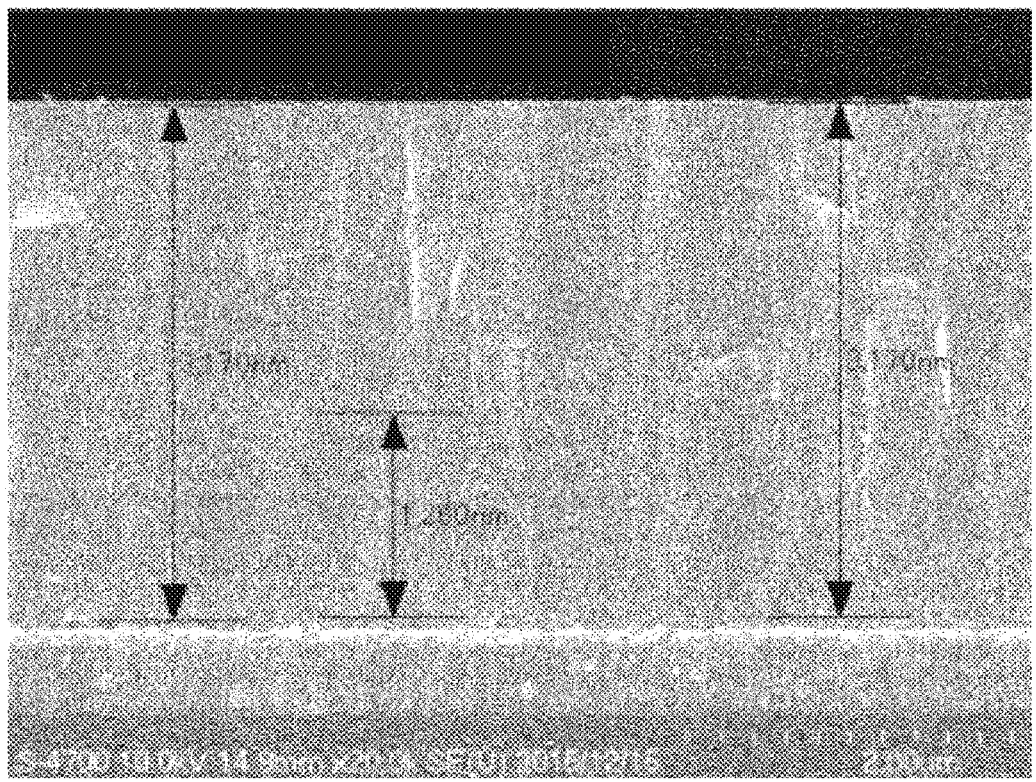
FIG. 18 is a SEM photograph illustrating a cross section of a piezoelectric film according to Example 2.
Figure 19:
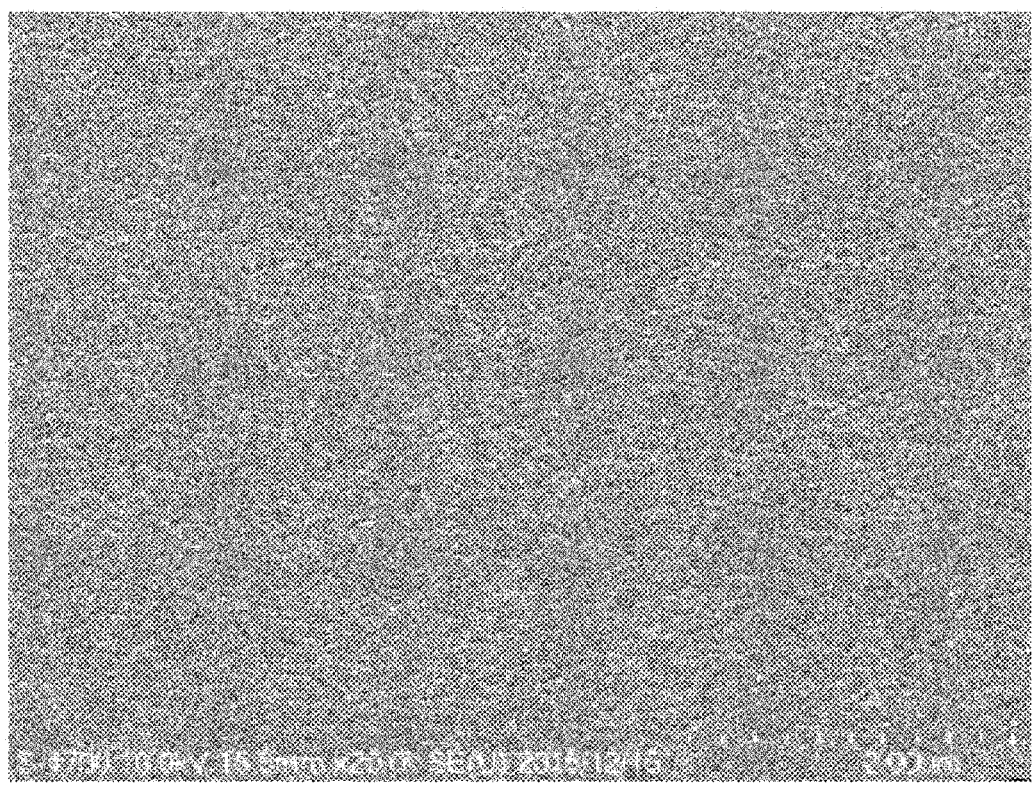
FIG. 19 is an SEM photograph illustrating a surface of the piezoelectric film according to Example 2.
Figure 20:
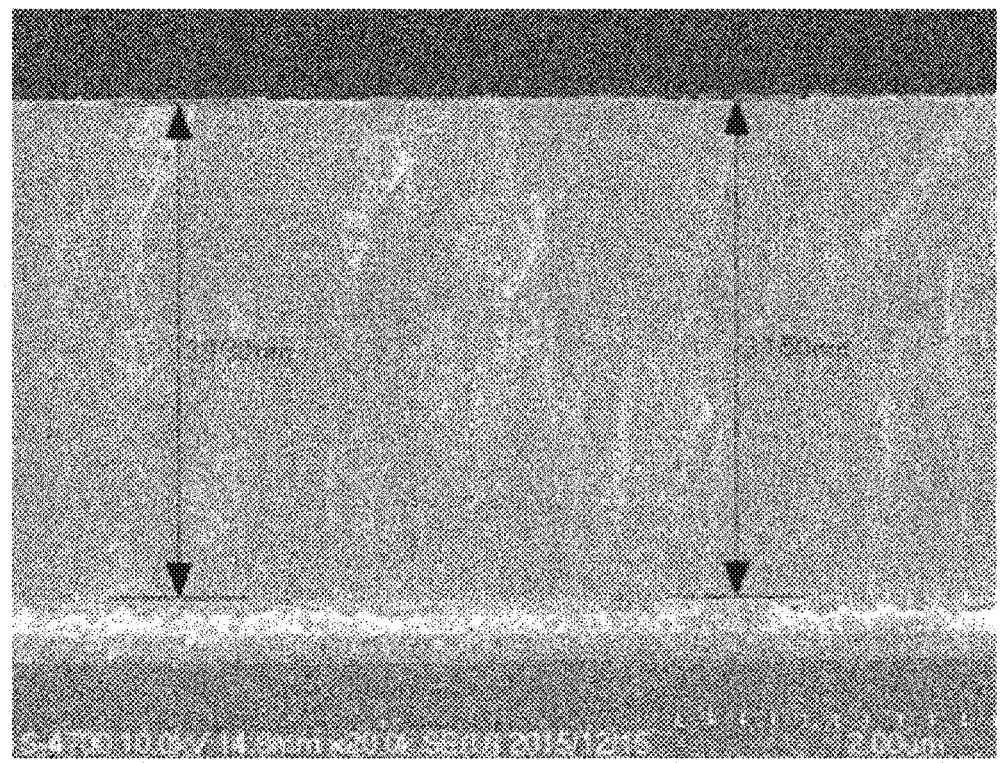
FIG. 20 is a SEM photograph illustrating a cross section of a piezoelectric film according to Comparative Example 2.
Figure 21:
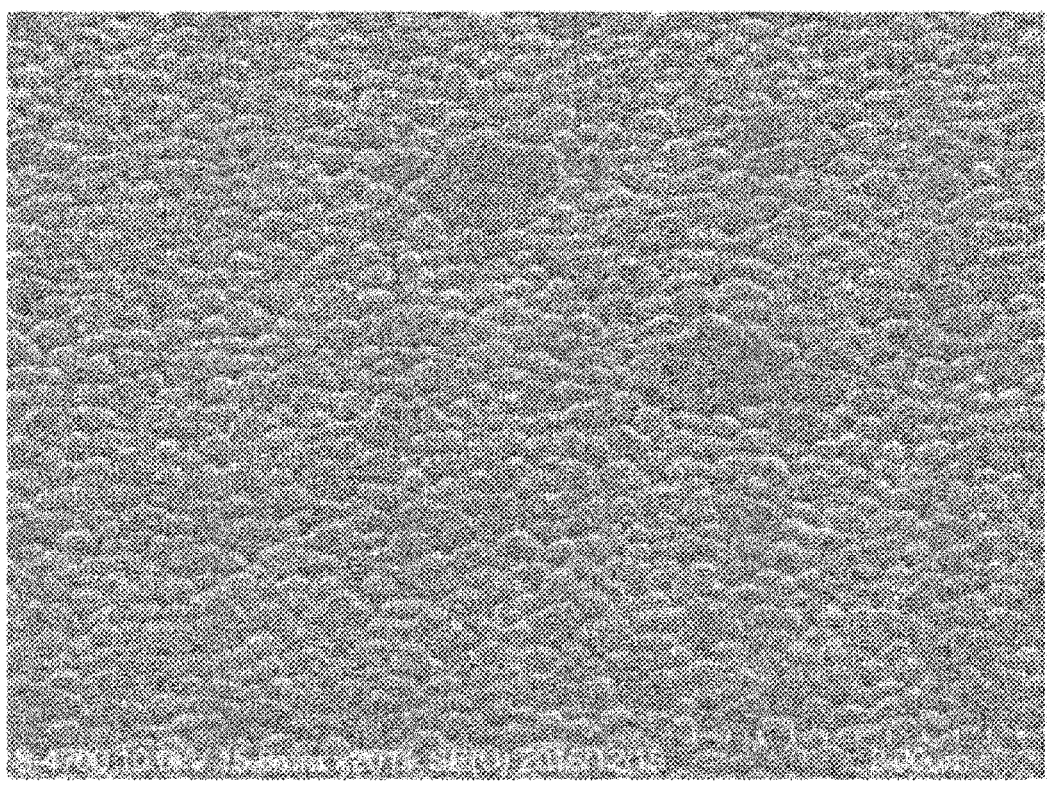
FIG. 21 is a SEM photograph illustrating a surface of the piezoelectric film according to Comparative Example 2.

As described above, in Examples 1 to 3 and Comparative Example 1, baking of the precursor layer of the PZT is performed at a relatively high temperature of 740° C. for each precursor layer by using RTA. In a case where the baking is performed, a (100) orientation ratio tends to increase as the thickness T of the piezoelectric film increases, as illustrated in FIG. 17. In contrast to this, in Comparative Examples 2 to 4, the precursor layer of the PZT is baked at a relatively low temperature of 600° C. for each precursor layer using the RTA except for the final layer, and at a relatively high temperature of 750° C. for the final layer at a furnace. In a case where the baking is performed, the (100) orientation ratio tends to decrease as the thickness T of the piezoelectric film increases, as illustrated in FIG. 17.
Diameter Variation of Crystal Grains FIG. 18 is a SEM photograph illustrating a cross section of the piezoelectric film according to Example 2. FIG. 19 is a SEM photograph illustrating a surface of the piezoelectric film according to Example 2. FIG. 20 is an SEM photograph illustrating a cross section of the piezoelectric film according to Comparative Example 2. FIG. 21 is an SEM photograph illustrating the surface of the piezoelectric film according to Comparative Example 2.

As illustrated in FIG. 18, the piezoelectric film according to Example 2 includes columnar crystal grains, and the crystal grains extend over the entire region in the thickness direction of the piezoelectric film. In addition, as illustrated in FIG. 19, the piezoelectric film according to Example 2 has a relatively small variance in diameter of crystal grains. In contrast to this, as illustrated in FIG. 20, the piezoelectric film according to Comparative Example 2 includes columnar crystal grains and the crystal grains extend over the entire region of the piezoelectric film in the thickness direction, and as illustrated in FIG. 21, variation in diameters of crystal grains are relatively large. In addition, Table 1 illustrates a standard deviation of the diameters of the crystal grains of the piezoelectric film in the width direction, in each of Examples and Comparative Examples.

Elemental Analysis

Figure 22:
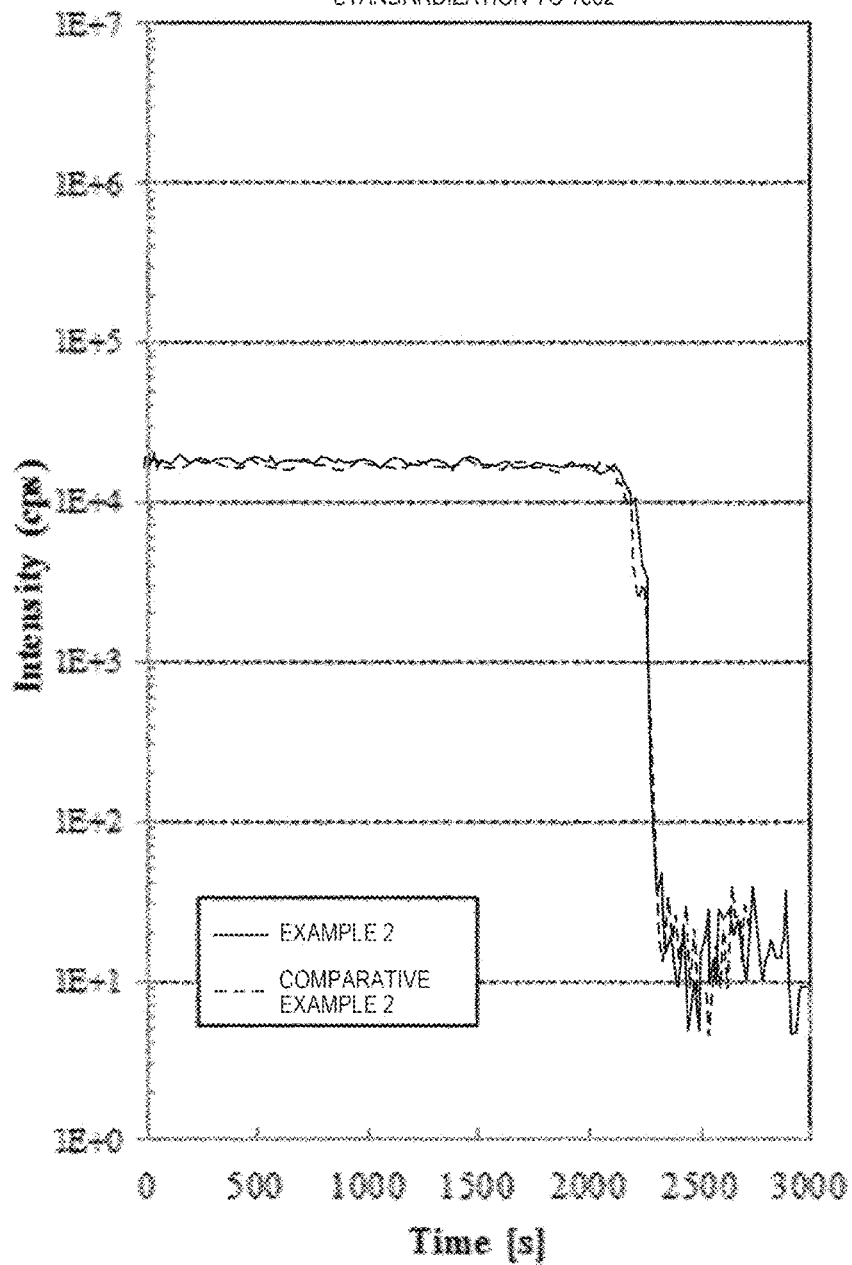
FIG. 22 is a graph illustrating results that leads (Pb) in the piezoelectric films according to Example 2 and Comparative Example 2 are analyzed by using a secondary ion mass analysis method.
Figure 23:
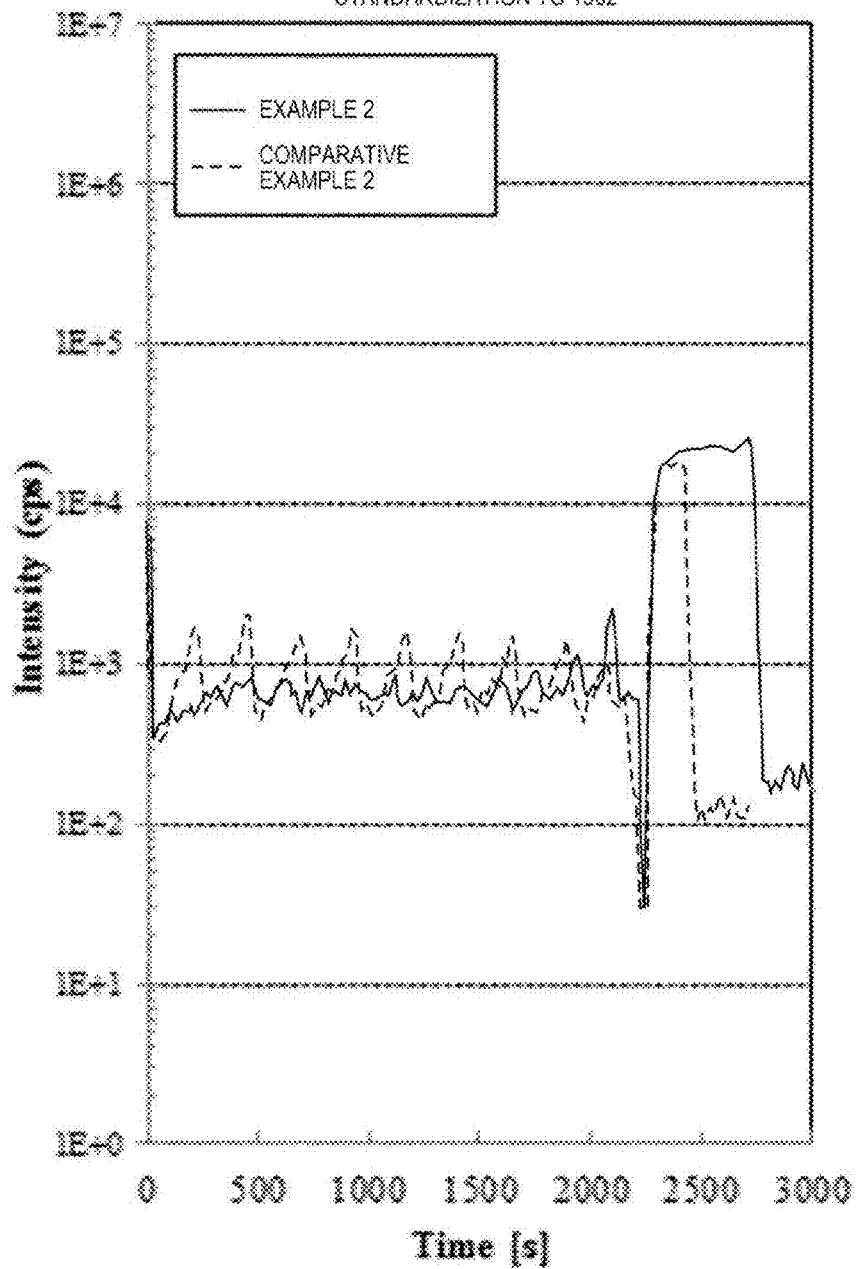
FIG. 23 is a graph illustrating results that carbons (C) in the piezoelectric films according to Example 2 and Comparative Example 2 are analyzed by using a secondary ion mass analysis method.
Figure 24:
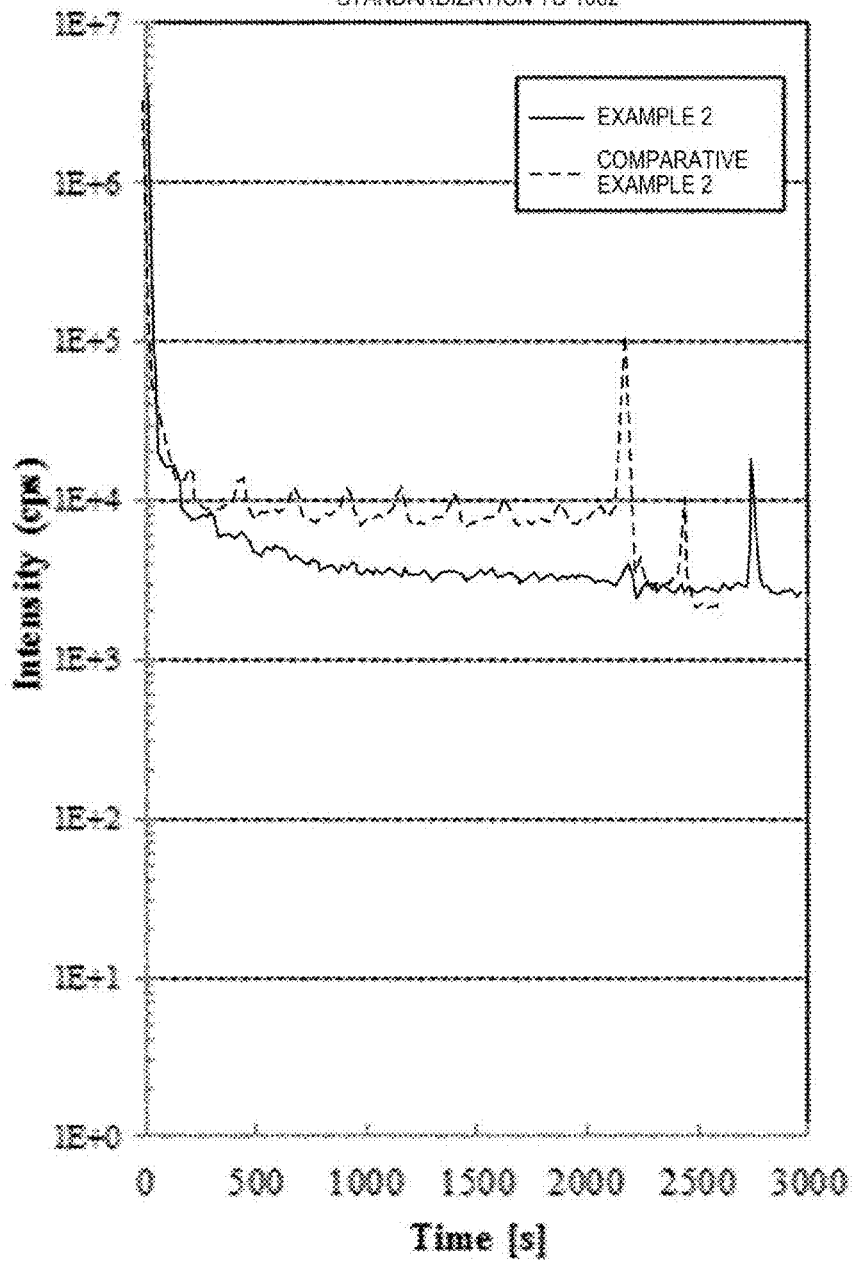
FIG. 24 is a graph illustrating results that Hydrogen (H) in the piezoelectric films according to Example 2 and Comparative Example 2 are analyzed by using a secondary ion mass analysis method.

FIG. 22 is a graph illustrating results of analyzing lead (Pb) in the piezoelectric film according to Example 2 and Comparative Example 2 using a secondary ion mass analysis method. FIG. 23 is a graph illustrating results of analyzing carbon (C) in the piezoelectric film according to Example 2 and Comparative Example 2 using the secondary ion mass analysis method. FIG. 24 is a graph illustrating results of analyzing hydrogen (H) in the piezoelectric film according to Example 2 and Comparative Example 2 using the secondary ion mass analysis method. Horizontal axes (Times) in FIGS. 22 to 24 correspond to a location of the piezoelectric film in the thickness direction, and Vertical axes (Intensity) correspond to the amount of elements to be measured.

As illustrated in FIG. 22, the amounts of lead in Example 2 and Comparative Example 2 are equal to each other. However, as illustrated in FIG. 23 and FIG. 24, in Example 2, the amount of carbon and hydrogen is smaller, composition fluctuation in the film thickness direction is smaller, and it can be said that a film quality is better as compared with Comparative Example 2.

Dielectric Loss

In Example 1 and Comparative Examples 1 and 2, a dielectric loss of a piezoelectric film was measured. As a result, the dielectric loss of the piezoelectric film according to Example 1 was 0.91%, the dielectric loss of the piezoelectric film according to Comparative Example 1 was 1.11%, and the dielectric loss of the piezoelectric film according to Comparative Example 2 was 2.46%. The dielectric loss was measured by an impedance analyzer in the RX mode and Fr=1 MHz.

The entire disclosure of Japanese Patent Application No. 2017-190191, filed Sep. 29, 2017 is expressly incorporated by reference herein.

What is claimed is:

1. A piezoelectric actuator comprising:
   a vibration portion;
   a support portion that is integrally configured with the vibration portion and supports the vibration portion; and
   a piezoelectric element that is disposed on the vibration portion, the piezoelectric element being configured with:
      a first electrode disposed on the vibration portion;
      a first piezoelectric film disposed on the first electrode;
      an intermediate film disposed on the first piezoelectric film;
      a second piezoelectric film disposed on the intermediate film; and
      a second electrode disposed on the second piezoelectric film,
   wherein the first and second piezoelectric films include columnar crystal grains extending in a thickness direction of each of the first and second piezoelectric films,
   when a thickness of a sum of the first piezoelectric film, the intermediate film, and the second piezoelectric film is referred to as T and an average diameter of the columnar crystal grains in a width direction, which is perpendicular to the thickness direction, is referred to as D, T/D is within a range of 10 to 100,
   the thickness of the sum of the first piezoelectric film, the intermediate film, and the second piezoelectric film is larger than or equal to 2 µm,
   a standard deviation of diameters of the columnar crystal grains in the width direction is less than or equal to 1.8 µm,
   the first and second piezoelectric films are formed of the same material, and a thickness of the second piezoelectric film is larger than a thickness of the first piezoelectric film, and
   the intermediate film includes titanium and is configured to reduce diffusion of an electrode component of the first electrode into the second piezoelectric film.

2. The piezoelectric actuator according to claim 1, wherein the thickness of the sum of the first piezoelectric film, the intermediate film, and the second piezoelectric film is within a range of 2 µm to 10 µm.

3. The piezoelectric actuator according to claim 1, wherein the average diameter of the columnar crystal grains in the width direction is within a range of 0.1 µm to 1 µm.

4. The piezoelectric actuator according to claim 1, wherein a thickness of the intermediate film is within a range of 2 nm to 6 nm.

5. The piezoelectric actuator according to claim 1, wherein the thickness of the first piezoelectric film is within a range of 60 nm to 160 nm.

6. A piezoelectric drive device comprising:
   the piezoelectric actuator according to claim 1; and
   a driven member that is driven by a driving force from the piezoelectric actuator.

7. A robot comprising
   the piezoelectric actuator according to claim 1.

8. An electronic component transport apparatus comprising
   the piezoelectric actuator according to claim 1.

9. A printer comprising
   the piezoelectric actuator according to claim 1.

10. The piezoelectric actuator according to claim 1, wherein each of the first and second piezoelectric films is formed of a material having a perovskite type crystal structure and has a (100) orientation ratio which is larger than or equal to 90%.

11. A piezoelectric drive device comprising:
    the piezoelectric actuator according to claim 10; and
    a driven member that is driven by a driving force from the piezoelectric actuator.

12. A robot comprising
    the piezoelectric actuator according to claim 10.

13. An electronic component transport apparatus comprising
    the piezoelectric actuator according to claim 10.

14. A printer comprising
    the piezoelectric actuator according to claim 10.

15. The piezoelectric actuator according to claim 1, wherein a dielectric loss of the first and second piezoelectric films is less than or equal to 2%.

16. A piezoelectric drive device comprising:
    the piezoelectric actuator according to claim 15; and
    a driven member that is driven by a driving force from the piezoelectric actuator.

17. A robot comprising
    the piezoelectric actuator according to claim 15.

18. An electronic component transport apparatus comprising
    the piezoelectric actuator according to claim 15.

* * * * *